United States Patent
Wada et al.

(10) Patent No.: US 6,494,584 B1
(45) Date of Patent: Dec. 17, 2002

(54) ULTRAVIOLET OPTICAL DEVICE HAVING AN OPTICAL PART WITH A GAS SPRAYED THEREON

(75) Inventors: Hiroyuki Wada, Kanagawa (JP); Michio Oka, Tokyo (JP); Koichi Tatsuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/588,648

(22) Filed: Jun. 7, 2000

(30) Foreign Application Priority Data

Jun. 8, 1999 (JP) .......................... 11-161252
Jun. 8, 1999 (JP) .......................... 11-161253

(51) Int. Cl.⁷ ................................ G02B 7/00
(52) U.S. Cl. ...................... 359/507; 359/509
(58) Field of Search ............... 250/504 R, 493.1; 359/507, 509

(56) References Cited

U.S. PATENT DOCUMENTS 4,560,883 A * 12/1985 Kerschgens ............. 250/504 R

* cited by examiner

*Primary Examiner*—Kiet T. Nguyen
(74) *Attorney, Agent, or Firm*—Sonnenschein, Nath & Rosenthal

(57) ABSTRACT

An ultraviolet optical device includes optical parts on which an ultraviolet ray is irradiated. Some or all of the optical parts are arranged in an envelope having a gas inlet port and a gas output port. In the envelope (9), a dry gas having an amount of moisture (as volume fraction) of 5,000 [ppm] or less and led from the gas inlet port (10) is sprayed on an optical part in which at least a deterioration in optical characteristics is especially a problem, so that an improvement in the secular change of the optical part can be achieved.

13 Claims, 20 Drawing Sheets

ULTRAVIOLET OPTICAL DEVICE HAVING AN OPTICAL PART WITH A GAS SPRAYED THEREON

RELATED APPLICATION DATA

The present application claims priority to Japanese Application No. P11-161253 filed Jun. 8, 1999 and Japanese Application No. P11-161252 filed Jun. 8, 1999, which applications are incorporated herein by reference to the extent permitted by law.

BACKGROUND OF THE INVENTION

1. Field of the Invention

The present invention relates to an ultraviolet optical device, e.g., an ultraviolet ray generation device, or an ultraviolet optical device such as an exposure device using an ultraviolet ray.

2. Description of the Prior Art

Conventionally, an ultraviolet ray having a wavelength of 400 nm or less is irradiated on an optical part in the atmosphere. Moisture and oil from the atmosphere that are on the surface of the optical part react, and reactants, peripheral particles, and the like adhere to the surface of the optical part. As a result, the optical characteristics of the optical part are inconveniently deteriorated.

Particularly, in waveform conversion (M. Oka and S. Kubota, JJAP. Vol. 31 (1992) pp 513 or M. Oka et. al., of Conference on Laser and Electro-Optics (OSA, Washington D.C., 1992) or the like of an external resonator type, a small deterioration in performance of a mirror or a nonlinear optical element arranged in a resonator considerably reduces a harmonic output which is generated.

For example, an ultraviolet optical device of an external resonator type, which converts, e.g., a fundamental wave having a wavelength of 532 nm into an ultraviolet ray having a wavelength of 266 nm in a resonator, has first to fourth mirrors 1 to 4 constituting an external resonator as shown in FIG. 20. The first to third mirrors 1 to 3 are constituted by high-reflectance mirrors each having a reflectance of, e.g., 99.95% or more with respect to the wavelength of 532 nm of the fundamental wave, and the fourth mirror 4 is constituted by a mirror having a reflectance of, e.g., 99% or more with respect to the wavelength of 532 nm.

Between the first and fourth mirrors 1 and 4, a nonlinear optical element 5, e.g., barium borate β-BaB$_2$O$_4$ (to be referred to as BBO hereinafter) is arranged. Both the end faces, i.e., a light-incidence end face 5a and a light-emission end face 5b of the nonlinear optical element 5 are polished into mirror planes, respectively, to form low-reflectance films each having a reflectance of 0.1% or less with respect to the wavelength of 532 nm of the fundamental wave.

With this configuration, incident light 6, i.e., a fundamental wave having the wavelength of 532 nm and reaching through the fourth mirror 4, is amplified among the first to fourth mirrors 1 to 4, and an ultraviolet ray having a wavelength of 266 nm of the second harmonic wave of the fundamental wave is led by the nonlinear optical element 5 from the light-emission end face 5b. An ultraviolet ray obtained by waveform conversion as described above is output as emission light 7 through the first mirror having a transmittance which is high with respect to the wavelength of the ultraviolet ray.

In the external resonator, the third mirror 3 is arranged in an actuator (not shown) constituted by, e.g., a so-called VCM (Voice Coil Motor), and the position of the third mirror 3 is adjusted.

When the wavelength conversion is performed in the atmosphere, the optical characteristics of the mirrors constituting the external resonator deteriorate. More specifically, an optical loss caused by enlargement of scattering increases. In particular, on the light emission end face side of the nonlinear optical element, which receives large quantity of ultraviolet light, i.e., light having a short wavelength of 400 nm or less, an optical loss on the first mirror 1 in FIG. 20 considerably increases.

This optical loss and an output Pω obtained by amplifying the fundamental wave having a wavelength of 532 nm in the external resonator are expressed by the following equation (11):

$$P\omega = \sqrt[4]{(\delta cav_2 + 4\gamma_{SH}P_i - \delta cav)/2\gamma_{SH}} \quad (11)$$

where, δcav is an optical loss at a wavelength of 532 nm in the external resonator, Pω is an output of an amplified fundamental wave, $P_i$ is an output of an incident fundamental wave on to the nonlinear optical element 5, and $\gamma_{SH}$ is a constant which is called a nonlinear conversion factor determined on the basis of the crystal length of the nonlinear optical element 5, the wave length of the fundamental wave, the spot size of the incident fundamental wave, and a focusing parameter.

According to equation (11), it is understood that, when the optical loss δcav increases, the output Pω of the fundamental wave decreases.

On the other hand, the relationship between the output Pω of the fundamental wave and an output P2ω of a second harmonic wave can be expressed by the following equation (12):

$$P2\omega = \gamma_{SH}P\omega^2 \quad (12)$$

According to equation (12), it is understood that, when the output Pω of the fundamental wave decreases, the output P2ω of the second harmonic wave also decreases.

Actually, with the configuration in FIG. 20, when a secular change in output was measured, where ultraviolet light was generated in the atmosphere in a clean room (volume fraction of moisture amount of about 8,000 [ppm]), the results shown in FIG. 18 were obtained.

As is apparent from the results, an ultraviolet output becomes half about 47 hours after in the atmosphere having the moisture amount, after which ultraviolet light cannot be stably obtained.

However, in an ultraviolet generation device used as a light source of, e.g., an exposure device in photolithographic techniques for making a semiconductor device or other various devices or the like, it is desirable to have stability for about 200 hours, and desirable to have at least the half-value period of the output for 200 hours or longer.

The present invention makes it possible to obtain an ultraviolet optical device having an optical part which is subjected to ultraviolet irradiation according to the above-described object.

SUMMARY OF THE INVENTION

The present invention makes it possible to obtain an ultraviolet optical device comprising an optical part on which an ultraviolet ray is irradiated, which meets the above-described object.

The present invention is an ultraviolet optical device comprising optical parts on which an ultraviolet ray is irradiated, wherein some or all of the optical parts are arranged in an envelope having a gas inlet port and a gas output port, and a dry gas led from the gas inlet port is sprayed on an optical part, which has a problem of deterioration in its optical characteristics.

The ultraviolet optical device according to the present invention is an ultraviolet optical device, having a nonlinear optical element in a resonator, for generating an ultraviolet ray, wherein the relationship between time T [time] at which an ultraviolet output is x [%] with respect to an initial output and a volume fraction Rw [ppm] of moisture of an arrangement portion of all or some of the optical parts on which the ultraviolet ray is irradiated is expressed by the following expression:

$$T \geq (5 \times 10^4 \gamma_{SH}{}^{0.5} P_{UV}{}^{-0.5} \exp(-0.00081381 \cdot Rw)) \times (-P_i + P_{UV} + x^{-0.5}(P_i - P_{UV}/2)) \quad (1)$$

where, $P_i$, $P_{UV}$, and $\gamma_{SH}$ are constants, $P_i$ is an output [W] of an incident fundamental wave onto the nonlinear optical element, $P_{UV}$ is an ultraviolet output [W] on an emission end face of the nonlinear optical element, and $\gamma_{SH}$ is a nonlinear conversion factor [$W^{-1}$]).

In addition, the ultraviolet optical device according to the present invention is an ultraviolet optical device, having a nonlinear optical element in a resonator, for generating an ultraviolet ray, wherein the relationship between an increase in in-resonator loss $\Delta\delta/\Delta T$ [%/hour] per unit time and a volume fraction Rw [ppm] of moisture of an arrangement portion of all or some of the optical parts on which the ultraviolet ray is irradiated is expressed by the following expression:

$$\Delta\delta/\Delta T \leq 2 \times 10^{-5} \exp(-0.00081381 \cdot Rw) \quad (3).$$

As described above, according to the present invention, it is confirmed that the deterioration in optical characteristics of an optical part on which an ultraviolet ray is irradiated can be considerably reduced by actively spraying the dry gas.

In each of the devices according to the present invention, an amount of moisture in the arrangement portion of the optical part on which the ultraviolet ray is irradiated is selected to reduce an ultraviolet output, i.e., to set the life time of the optical part.

DETAILED DESCRIPTION OF PREFERRED EMBODIMENTS

An ultraviolet optical device according to the present invention is an ultraviolet optical device comprising optical parts on which an ultraviolet ray is irradiated. The ultraviolet optical device is, e.g., an ultraviolet generation device; an optical device in which an ultraviolet ray is irradiated; an external resonator type ultraviolet generation device having a resonator and optical parts, e.g., a lens, a mirror, or a nonlinear optical element. In ultraviolet optical devices, the optical parts, e.g., all of the nonlinear optical elements or the mirror of the resonator, can experience considerable deterioration in their characteristics because of heavy ultraviolet irradiation. This can cause a problem which adversely affects the secular change or the life time of the optical device. In accordance with the present invention, the optical devices are arranged in an envelope having a gas inlet port and a gas outlet port, and a dry gas from the gas inlet port is sprayed on the optical part which has the above-described problem.

The dry gas to be sprayed can be air having an amount of moisture which is 5,000 [ppm] or less as a volume fraction, an inert gas such as an argon (Ar) gas, or a nitrogen (N) gas. For example, atmospheric air can be used such that an amount of moisture is reduced to a desired amount of moisture by a drying device, i.e., a dryer. However, the amount of moisture is desirably set to be larger than 1,000 [ppm] in consideration of industrial utility because the atmosphere can be easily handled for the drying device, pipes, a gas to be used, and the like and because the cost can be reduced.

An embodiment of an ultraviolet optical device according to the present invention will be described below with reference to the accompanying drawings.

In this embodiment, a deterioration in optical characteristics of optical parts constituting the ultraviolet generation device body is to be improved. In this embodiment, the present invention is applied to an external resonator type ultraviolet generation device.

Figure 1:
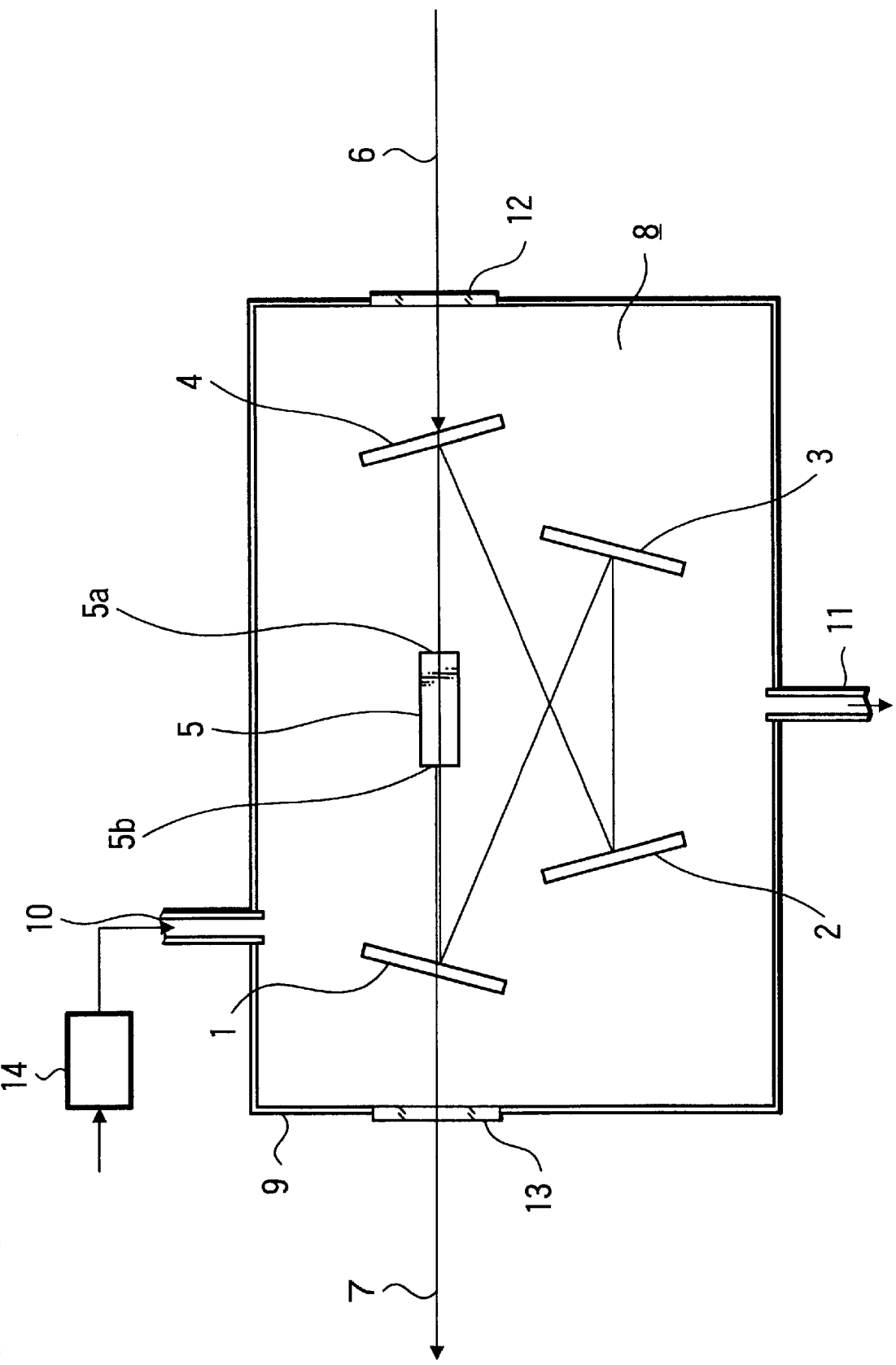
FIG. 1 is a diagram of an ultraviolet optical device according to the present invention.
Figure 20:
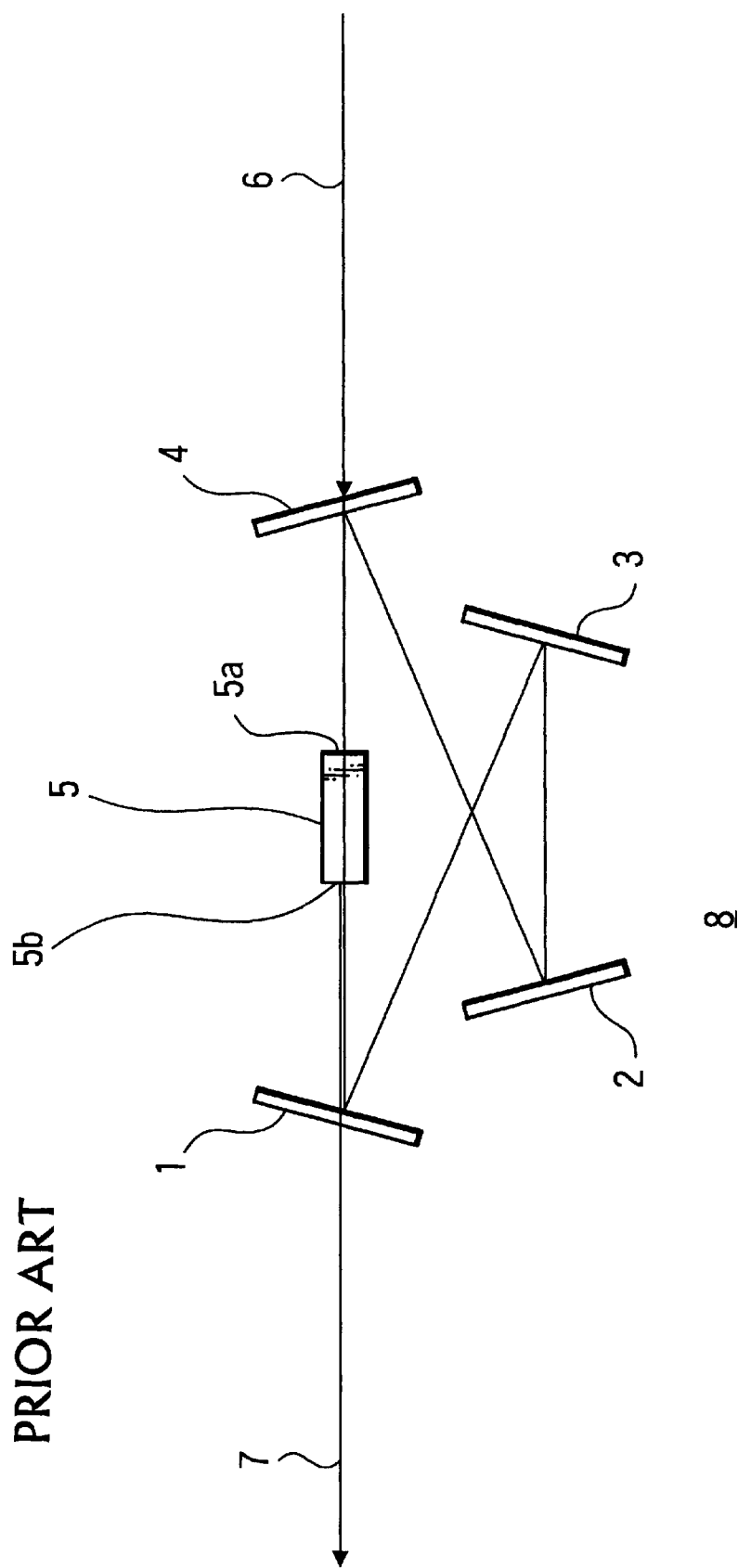
FIG. 20 is a diagram showing a conventional ultraviolet optical device.

FIG. 1 is a schematic diagram of an example of the embodiment of the device of the present invention having the ultraviolet generation device described in FIG. 20 as a basic configuration. The device of the present invention is not limited to this example, as a matter of course.

In this example, a resonator, in which a nonlinear optical element 5 which can generate the second harmonic wave of a fundamental wave, i.e., can obtain an ultraviolet ray, is arranged in a fundamental wave light path in an resonator, i.e., an ultraviolet optical device body 8 (ultraviolet generation device body in this example), is accommodated in an envelope 9.

The ultraviolet optical device body 8, e.g., as in the above description, converts a fundamental wave having, e.g., a wavelength of 532 nm into an ultraviolet ray having a wavelength of 266 nm in the resonator. More specifically, the ultraviolet optical device body 8 has first to fourth mirrors 1 to 4 constituting an external resonator. The first to third mirrors 1 to 3 are constituted by high-reflectance mirrors each having a reflectance of, e.g., 99.95% or more with respect to the wavelength of 532 nm of the fundamental wave, and the fourth mirror 4 is constituted by a mirror having a reflectance of, e.g., 99% or more with respect to the wavelength of 532 nm.

The nonlinear optical element 5 is arranged between the first and fourth mirrors. The nonlinear optical element 5 is constituted by a nonlinear optical crystal consisting of, e.g., BBO.

Both the end faces of the nonlinear optical element 5, i.e., a light-incidence end face 5a and a light-emission end face are polished into mirror planes, respectively, to form low-reflectance films each having a reflectance of 0.1% or less with respect to the wavelength of 532 nm of the fundamental wave.

With this configuration, incident light 6, i.e., a fundamental wave having the wavelength of 532 nm and reaching through the fourth mirror 4 is amplified among the first to fourth mirrors 1 to 4, and an ultraviolet ray having a wavelength of 266 nm of the second harmonic wave of the fundamental wave is led by the nonlinear optical element 5 from the light-emission end face 5b. An ultraviolet ray obtained by waveform conversion as described above is output as emission light 7 through the first mirror having transmittance which is high with respect to the wavelength of the ultraviolet ray.

In the external resonator, the third mirror 3 is arranged in an actuator (not shown) constituted by, e.g., a VCM as described above, and the position of the third mirror 3 is adjusted.

The envelope 9 is constituted by an airtight vessel having a gas inlet port 10 and a gas outlet port 11. A dry gas such as dry air, a dry argon gas which is a dry inert gas, or a dry nitrogen gas is led from the gas inlet port 10.

In the envelope 9, a transparent window 12 for leading in fundamental wave incident light 6 and a transparent window 13 for leading out emission light, i.e., an ultraviolet ray are formed to be airtight to the envelope 9. More specifically, the transparent window 12 has a transmittance which is high with respect to the incident light 6, i.e., light having the wavelength of the basis wave, and the transparent window 13 has a transmittance which is high with respect to the ultraviolet ray of the emission light 7.

The dry gas supplied from the gas inlet port 10 of the envelope 9 can be obtained such that, by using a drying device 14, e.g., a so called dryer such as a film type air dryer SWC (available from Asahi Glass Engineering Co., Ltd.) or a membrane dryer (available from Ube Industries, Ltd.), clean air is passed through the drying device 14.

FIG. 1 illustrates a case in which the dry gas is mainly sprayed on the first mirror 1 on which the ultraviolet ray generated from the nonlinear optical element 5 is directly irradiated, that is, strong ultraviolet irradiation is performed, and an external resonator type ultraviolet generation device whose optical characteristics considerably influences an ultraviolet output from the ultraviolet generation device. In this case, the gas inlet port 10 and the gas outlet port 11 are arranged above and below the envelope 9 to sandwich a body 8 arranged in the envelope 9 in FIG. 1, respectively, the inner opening of the gas outlet port 11 is formed near the first mirror 1, and the dry gas is mainly sprayed on the first mirror 1.

The amount of moisture (volume fraction) of the dry gas is set at 5,000 [ppm] or less. However, for the above reason, the volume fraction is desirably 5,000 [ppm] or less and larger than 1,000 [ppm].

Figure 2:
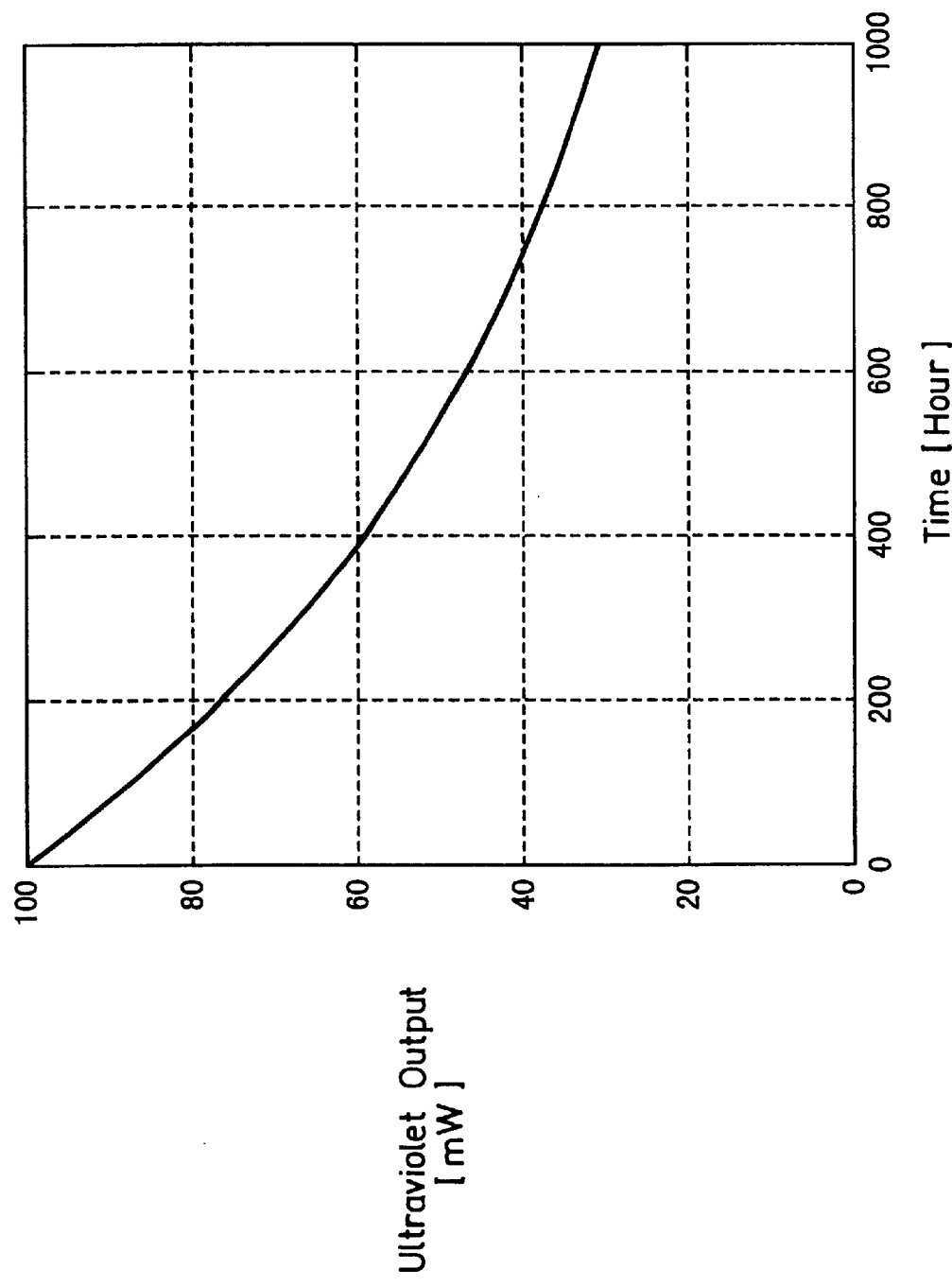
FIG. 2 is a graph showing a secular change in ultraviolet output of the ultraviolet optical device.

A secular change in ultraviolet output obtained by the ultraviolet ray optical device having the above configuration is shown in FIG. 2. In FIG. 2, time is plotted on the abscissa, and the ultraviolet output is plotted on the ordinate.

At this time, when an output P2ω and an incident fundamental wave output $P_i$ are measured, in-external-resonator losses δcav at respective times on the basis of expressions (11) and (12).

Figure 3:
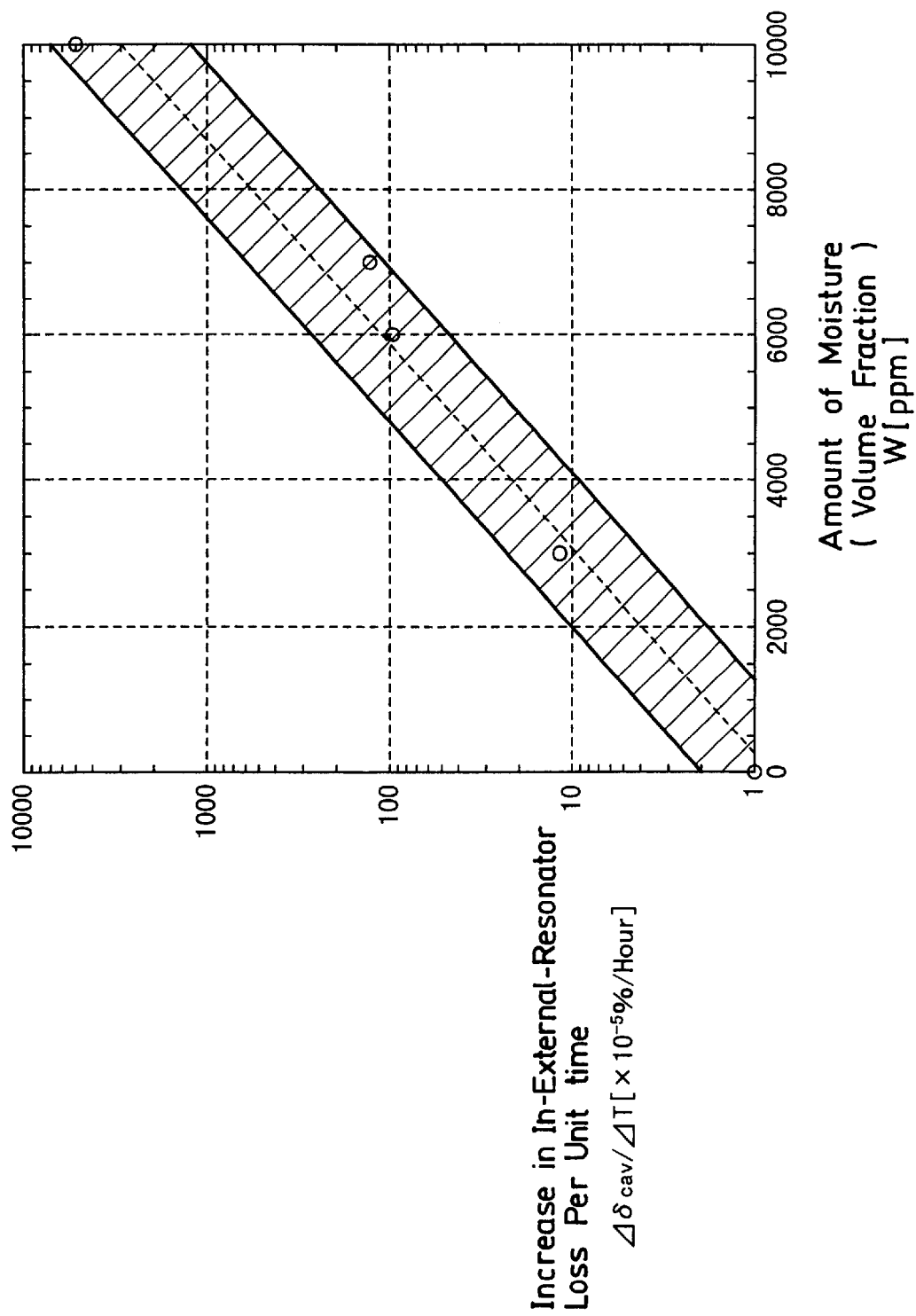
FIG. 3 is a graph showing the relationship between an increase in in-external-resonator loss $\Delta\delta\mathrm{cav}/\Delta T$ per unit time and an amount of moisture.

When the values are plotted as a function of time, it is understood that the values may be linearly approximated, and an increase in in-external-resonator loss Δδcav/ΔT per unit time ΔT when air having a certain amount of moisture is led in is calculated. FIG. 3 shows results obtained by plotting the increase in in-external-resonator loss Δδcav/ΔT per unit time as a function of the amount of moisture of the purged air. A range which is hatched in FIG. 3 is a range including an error of a measurement system.

In this case, in consideration of a measurement error, the relationship between the increase in in-external-resonator loss Δδcav/ΔT [%/time] per unit time and an amount of moisture (volume fraction) Rw [ppm] of the purged gas is expressed by the following expression (3):

$$\Delta\delta/\Delta T \geq 2\times 10^{-5} \exp(-0.00081381\cdot Rw) \quad (3)$$

When time at which the ultraviolet output becomes x [%] of the initial output is represented by T [time], the relationship among Δδ/ΔT, x, and T is expressed by the following expression (1):

$$T \geq (5\times 10^4 \gamma_{SH}^{0.5} P_{UV}^{-0.5} \exp(-0.00081381\cdot Rw))\times (-P_i + P_{UV} + x^{-0.5}(P_i - P_{UV}/2)) \quad (1)$$

Time T1 at which the ultraviolet output becomes half (x=0.5) of the initial output is expressed by the following expression (2):

$$T1 \geq (5 \times 10^4 \gamma_{SH}^{0.5} P_{UV}^{-0.5} \exp(-0.00081381 \cdot Rw)) \times (-P_i + P_{UV} + 0.5^{-0.5}(P_i - P_{UV}/2)) \quad (2)$$

Figure 4:
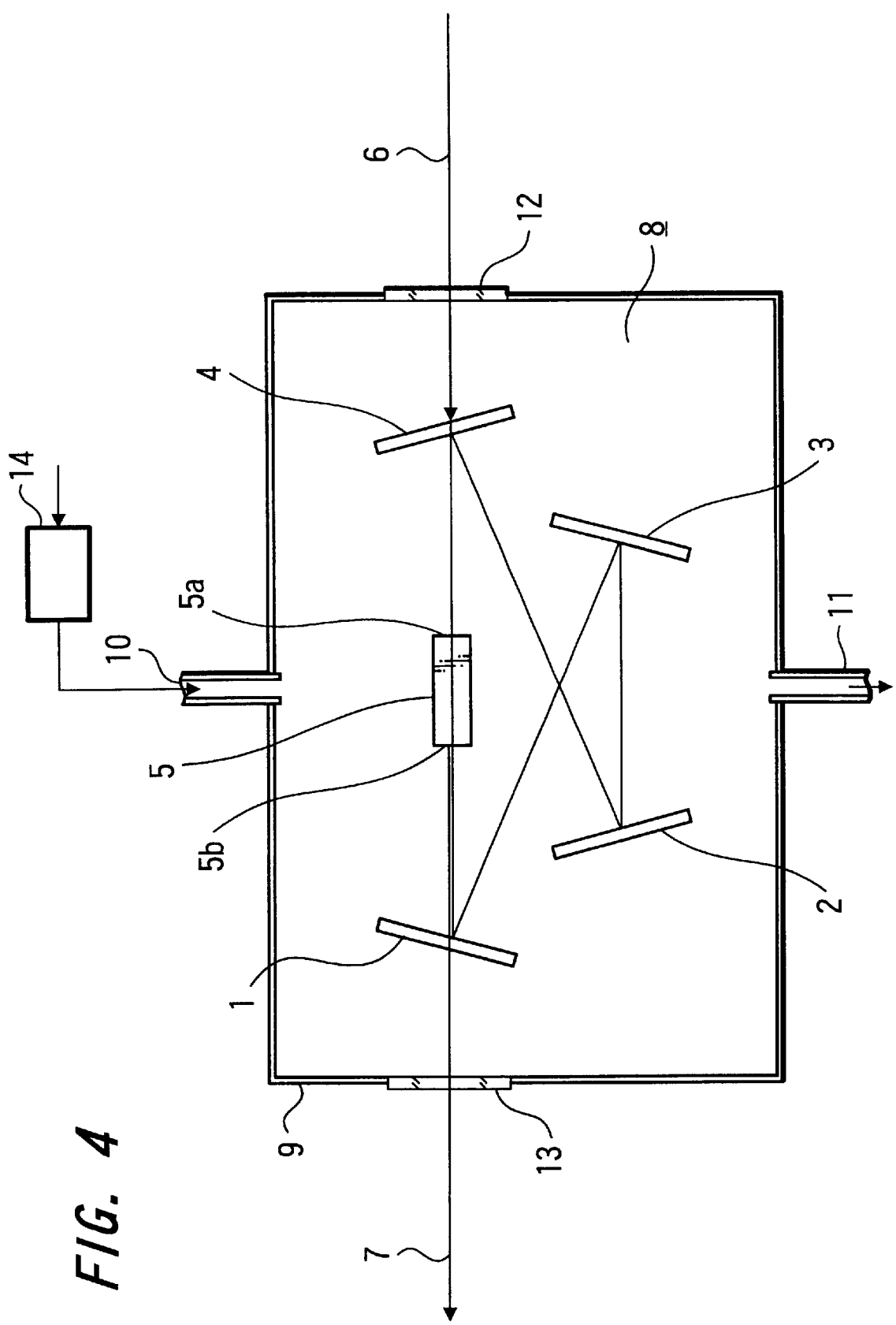
FIG. 4 is a diagram showing an ultraviolet optical device according to the present invention.

FIG. 4 is a schematic diagram showing another example in the embodiment of the present invention. The same reference numerals as in FIG. 1 denote the same parts in FIG. 4, and an overlapping description thereof will be omitted. In this example, a gas inlet port 10 and a gas outlet port 11 are formed above and below an envelope 9 to sandwich an ultraviolet optical device body 8 (ultraviolet generation device body, in this example) in the envelope 9 such that dry air is sprayed on the entire area of the device body.

Figure 5:
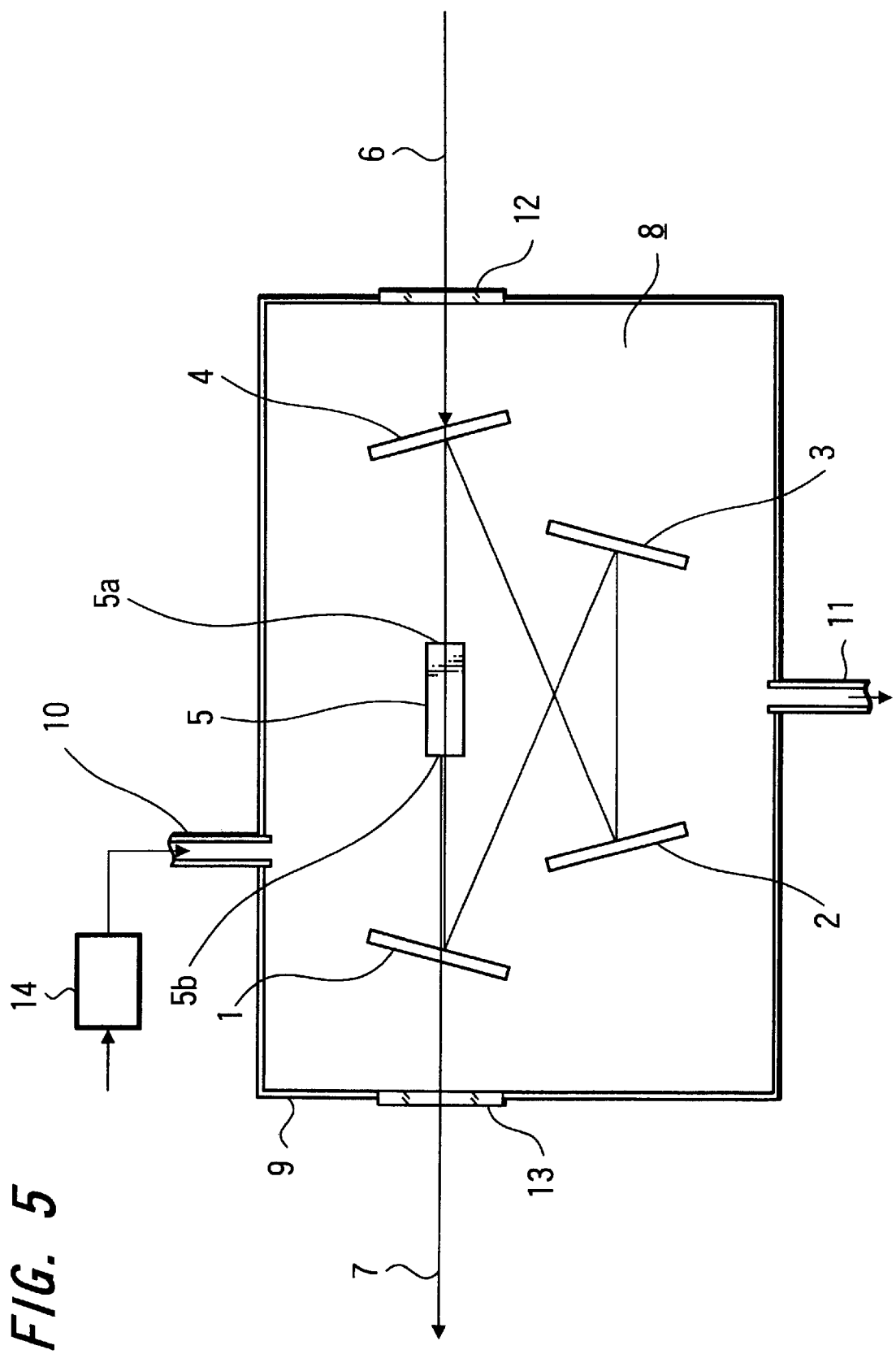
FIG. 5 is a diagram showing an ultraviolet optical device according to the present invention.

FIG. 5 is a schematic diagram showing still another example of the embodiment of the present invention. The same reference numerals as in FIG. 1 denote the same parts in FIG. 5, and an overlapping description thereof will be omitted. In this example, a gas inlet port 10 is arranged on a middle portion between a first mirror 1 and a nonlinear optical element 5, so that a dry gas is mainly sprayed on the first mirror 1 and the nonlinear optical element 5.

Figure 6:
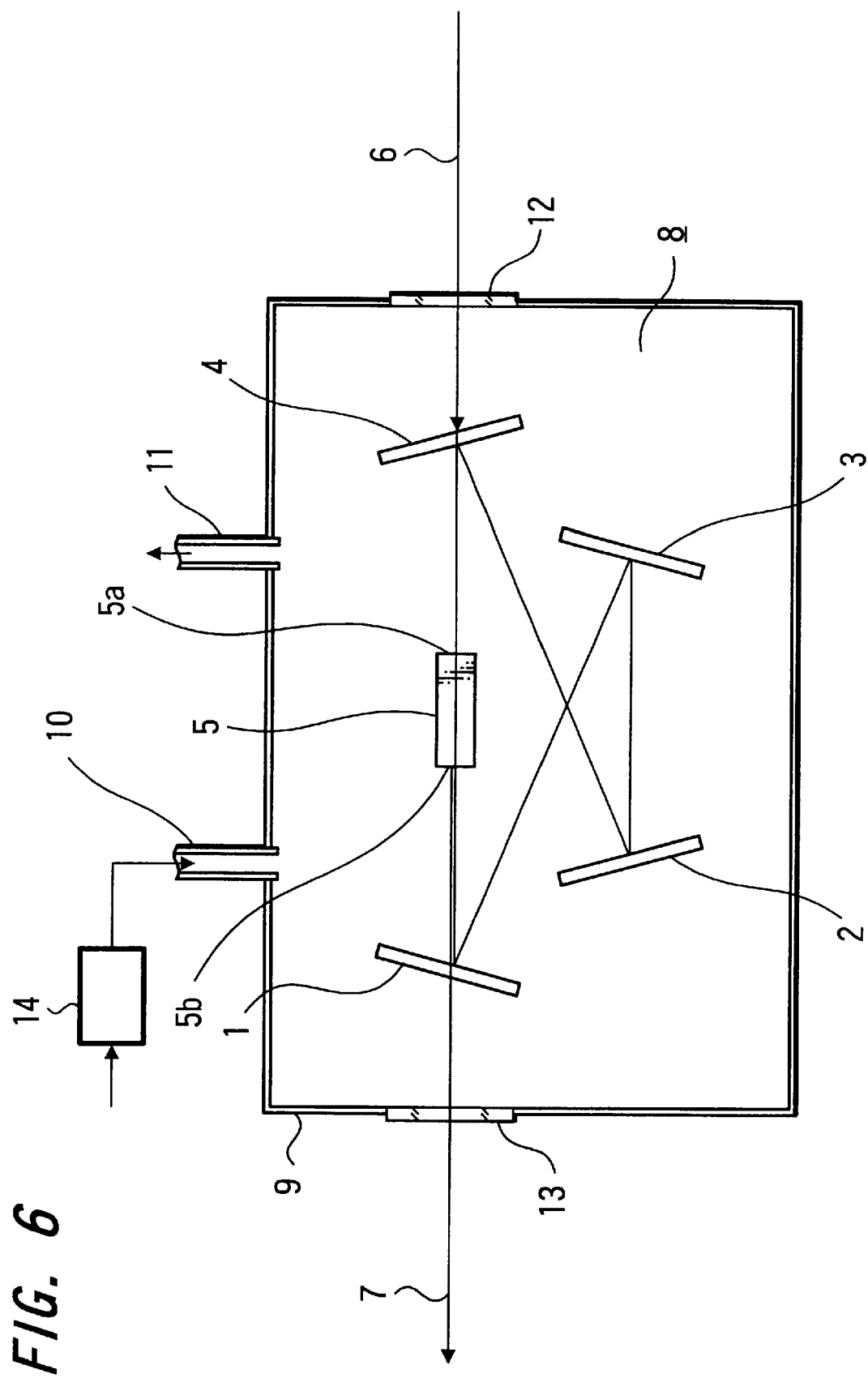
FIG. 6 is a diagram showing an ultraviolet optical device according to the present invention.

Furthermore, FIG. 6 is a schematic diagram showing still another example of the embodiment of the present invention. Also in this case, the same reference numerals as in FIG. 1 denote the same parts in FIG. 6, and an overlapping description thereof will be omitted. In this example, a gas inlet port 10 is arranged on a middle portion between a first mirror 1 and a nonlinear optical element 5, and a gas outlet port 11 is arranged on a middle portion between the nonlinear optical element 5 and a fourth mirror to be parallel to the gas inlet port 10 in an envelope 9. In this case, a dry gas is mainly circulated in the arrangement portions of the first mirror 1 and the nonlinear optical element 5, so that the dry gas is mainly sprayed on the first mirror 1 and the nonlinear optical element 5.

Figure 7:
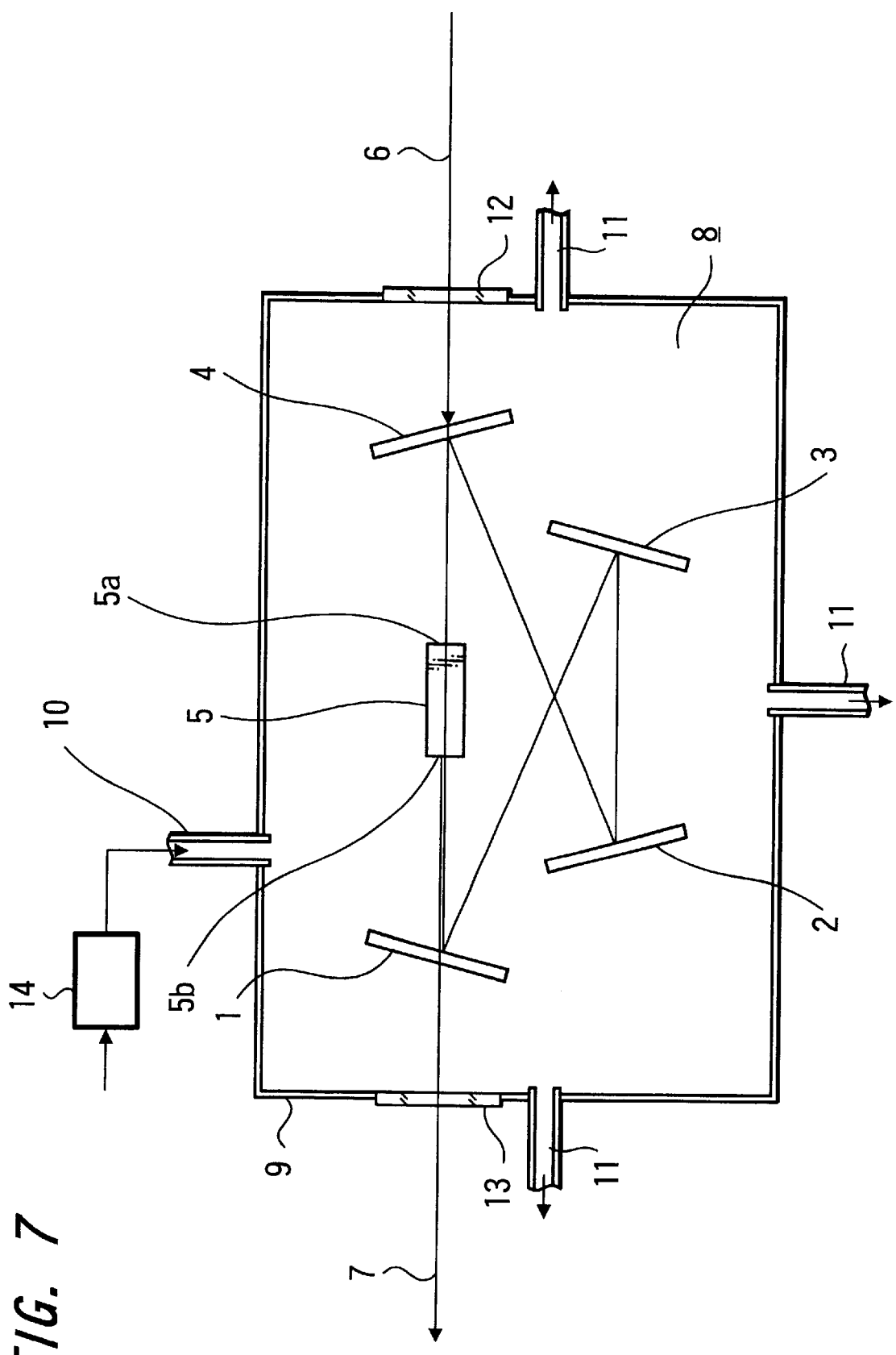
FIG. 7 is a diagram showing an ultraviolet optical device according to the present invention.

FIG. 7 is a schematic diagram showing still another example of the embodiment of the present invention. Also in this case, the same reference numerals as in FIG. 1 denote the same parts in FIG. 7, and an overlapping description thereof will be omitted. In this example, as well as the configuration in FIG. 6, a gas inlet port 10 is arranged on a middle portion between a first mirror 1 and a nonlinear optical element 5 on, e.g., the upper surface of an envelope 9, and a plurality of gas outlet ports 11 are arranged on the other side surfaces, e.g., the left and right side surfaces and the lower surface of the envelope 9, respectively, so that a dry gas is mainly sprayed on the first mirror 1 and the nonlinear optical element 5, and a deterioration in optical characteristics caused by circularly irradiating some ultraviolet ray is avoided with respect to the second to fourth mirrors 2 to 4.

Examples of the present invention will be described below. However, the present invention is not limited to the examples.

EXAMPLE 1

In the device of the present invention shown in FIG. 1, the inner diameters of the gas inlet port 10 and the gas outlet port 11 were set at, e.g., 8 mm, and dry air having an amount of moisture (volume fraction) of 5,000 [ppm] was supplied from the gas inlet port 10 at 0.5 [liter/min].

Figure 12:
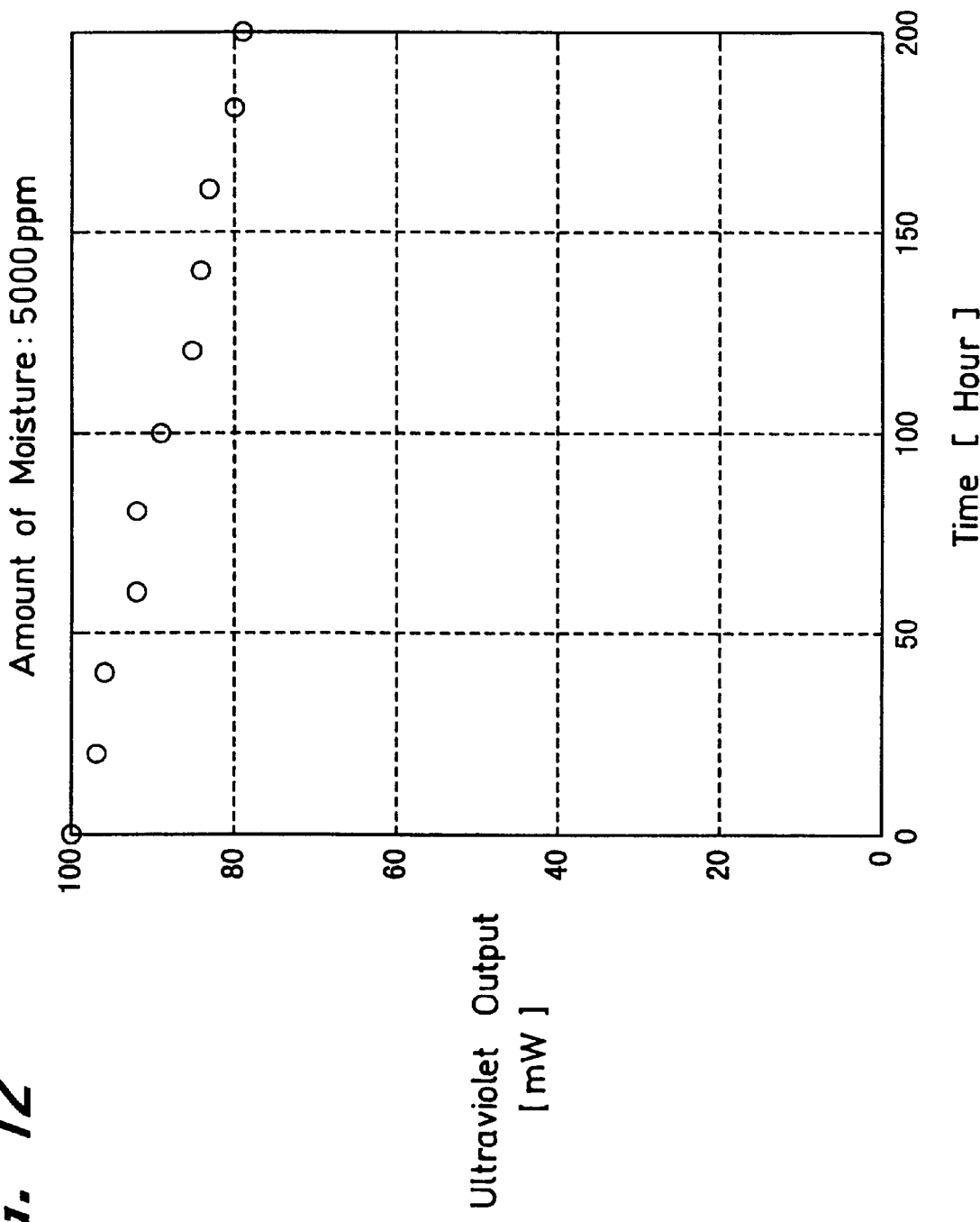
FIG. 12 is a graph showing a secular change in ultraviolet output when an amount of moisture (volume fraction) of a sprayed dry gas is set at 5,000 [ppm] in the ultraviolet optical device according to the present invention.
Figure 13:
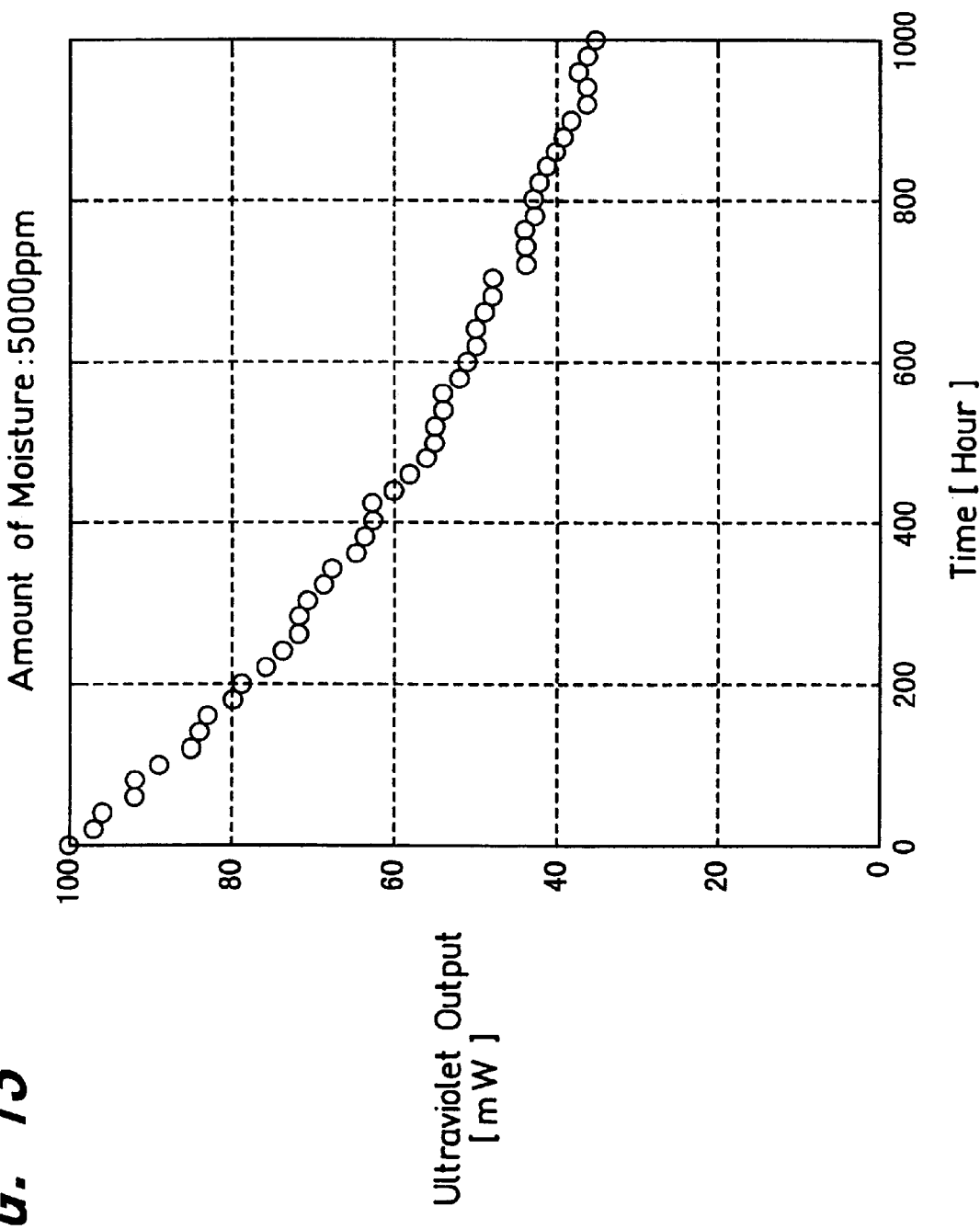
FIG. 13 is a graph showing a secular change in ultraviolet output when an amount of moisture (volume fraction) of a sprayed dry gas is similarly set at 5,000 [ppm] in the ultraviolet optical device according to the present invention.

The results obtained by measuring a secular change in output of the ultraviolet generation device are shown in FIGS. 12 and 13. As is apparent from the measurement results, the output of the ultraviolet generation device decreases by only 20% in 200 hours continuous use of the ultraviolet generation device, the half-value period reaches 500 hours.

EXAMPLE 2

Figure 14:
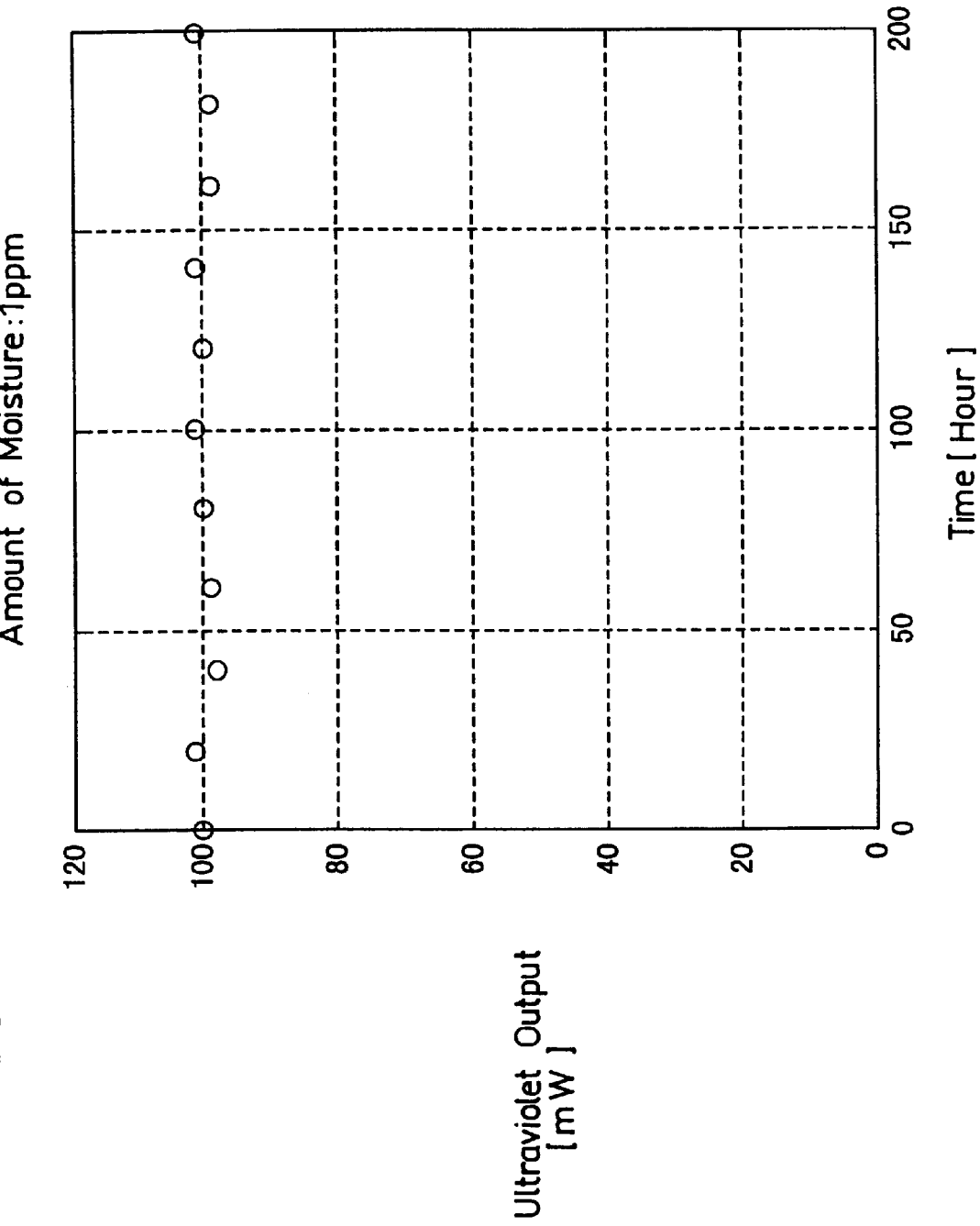
FIG. 14 is a graph showing a secular change in ultraviolet output when an amount of moisture (volume fraction) of a sprayed dry gas is set at 1 [ppm] in the ultraviolet optical device according to the present invention.
Figure 15:
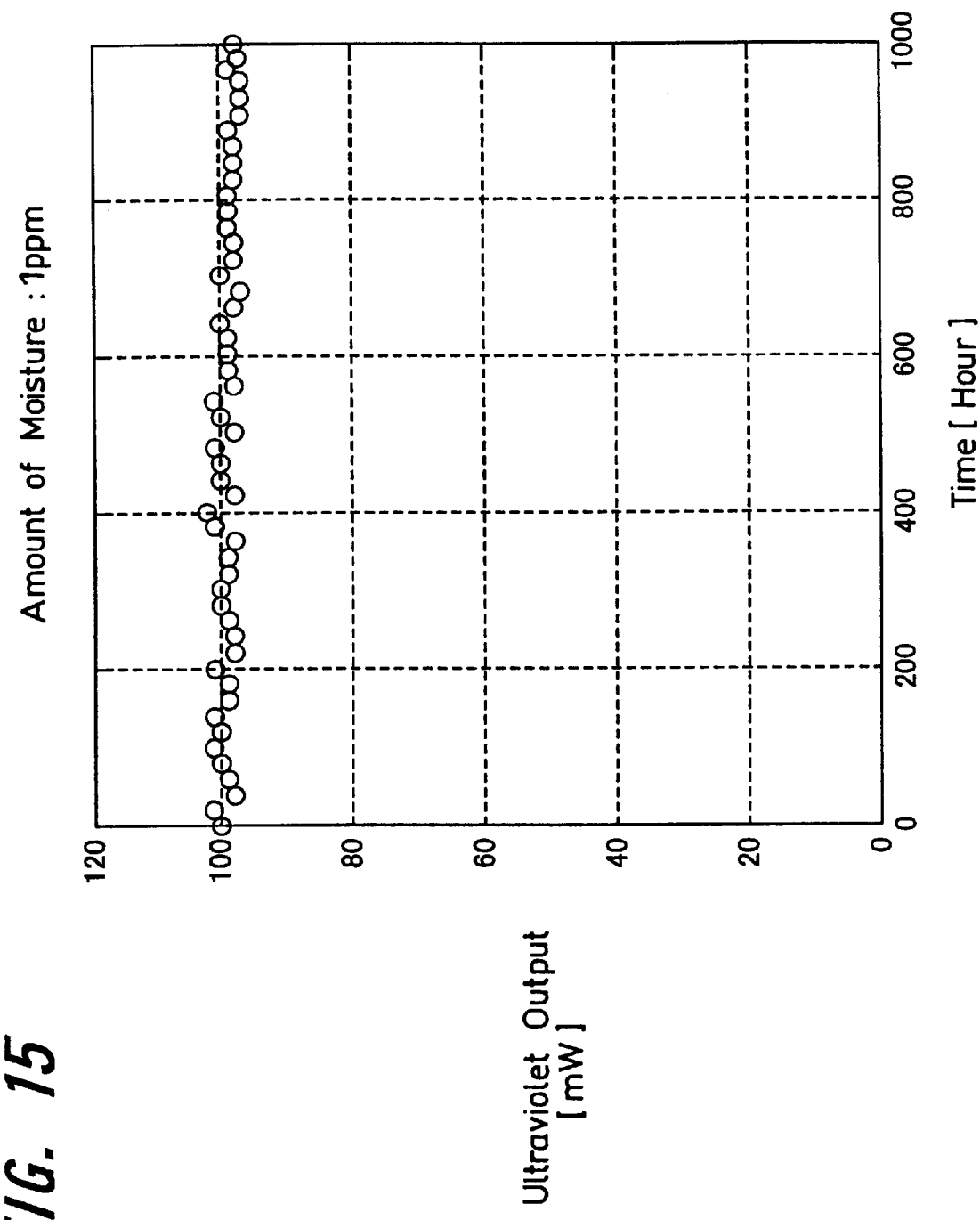
FIG. 15 is a graph showing a secular change in ultraviolet output when an amount of moisture (volume fraction) of a sprayed dry gas is similarly set at 1 [ppm] in the ultraviolet optical device according to the present invention.

The same configuration and operation as those in Example 1 are used in Example 1. However, in this case, an amount of moisture (volume fraction) was set at 1 [ppm]. The measurement results of a secular change in this case are shown in FIGS. 14 and 15. In this case, any change did not occur not only 200 hours after but also 1,000 hours after.

However, in this case, since use of a high-performance dryer, pipes, and the like must be considered, the actual viewpoint described at the beginning of the description, i.e., when use for about 200 hours or more is set as a target, as described above, a gas having a high degree of dryness need not be used.

EXAMPLE 3

In the device of the present invention shown in FIG. 4, the inner diameters of the gas inlet port 10 and the gas outlet port 11 are set at, e.g., 8 mm, and dry air having an amount of moisture (volume fraction) of 5,000 [ppm] was supplied from the gas inlet port 10 at 0.5 [liter/min].

As the results obtained by measuring a secular change in output of the ultraviolet generation device at this time, results which are almost the same as those in FIGS. 12 and 13 were obtained.

EXAMPLE 4

The same configuration and operation as those in Example 3 are used in Example 4. However, in this case, an amount of moisture (volume fraction) was set at 1 [ppm]. As the measurement results obtained by measuring a secular change in output of the ultraviolet generation device in this case, measurement results which were almost the same as those in FIGS. 14 and 15 were obtained.

EXAMPLE 5

In the device of the present invention shown in FIG. 5, the inner diameters of the gas inlet port 10 and the gas outlet port 11 are set at, e.g., 8 mm, and dry air having an amount of moisture (volume fraction) of 5,000 [ppm] was supplied from the gas inlet port 10 at 0.5 [liter/min].

As the results obtained by measuring a secular change in output of the ultraviolet generation device at this time, results which were almost the same as those in FIGS. 12 and 13 were obtained.

EXAMPLE 6

The same configuration and operation as those in Example 5 are used in Example 6. However, in this case, an amount of moisture (volume fraction) was set at 1 [ppm]. As the measurement results obtained by measuring a secular change in output of the ultraviolet generation device in this case, measurement results which were almost the same as those in FIGS. 14 and 15 were obtained.

EXAMPLE 7

In the device of the present invention shown in FIG. 6, the inner diameters of the gas inlet port 10 and the gas outlet port 11 are set at, e.g., 8 mm, and dry air having an amount of moisture (volume fraction) of 5,000 [ppm] was supplied from the gas inlet port 10 at 0.5 [liter/min].

As the results obtained by measuring a secular change in output of the ultraviolet generation device at this time, results which were almost the same as those in FIGS. 12 and 13 were obtained.

EXAMPLE 8

The same configuration and operation as those in Example 7 are used in Example 8. However, in this case, an amount of moisture (volume fraction) was set at 1 [ppm]. As the measurement results obtained by measuring a secular change in output of the ultraviolet generation device in this case, measurement results which were almost the same as those in FIGS. 14 and 15 were obtained.

EXAMPLE 9

In the device of the present invention shown in FIG. 7, the inner diameter of the gas inlet port 10 is set at, e.g., 8 mm, and the inner diameter of the gas outlet port 11 is set at 4 mm. Dry air having an amount of moisture (volume fraction) of 5,000 [ppm] was supplied from the gas inlet port 10 at 0.5 [liter/min].

As the results obtained by measuring a secular change in output of the ultraviolet generation device at this time, results which were almost the same as those in FIGS. 12 and 13 were obtained.

EXAMPLE 10

The same configuration and operation as those in Example 9 are used in Example 10. However, in this case, an amount of moisture (volume fraction) was set at 1 [ppm]. As the measurement results obtained by measuring a secular change in output of the ultraviolet generation device in this case, measurement results which were almost the same as those in FIGS. 14 and 15 were obtained.

Comparative Example 1

Figure 16:
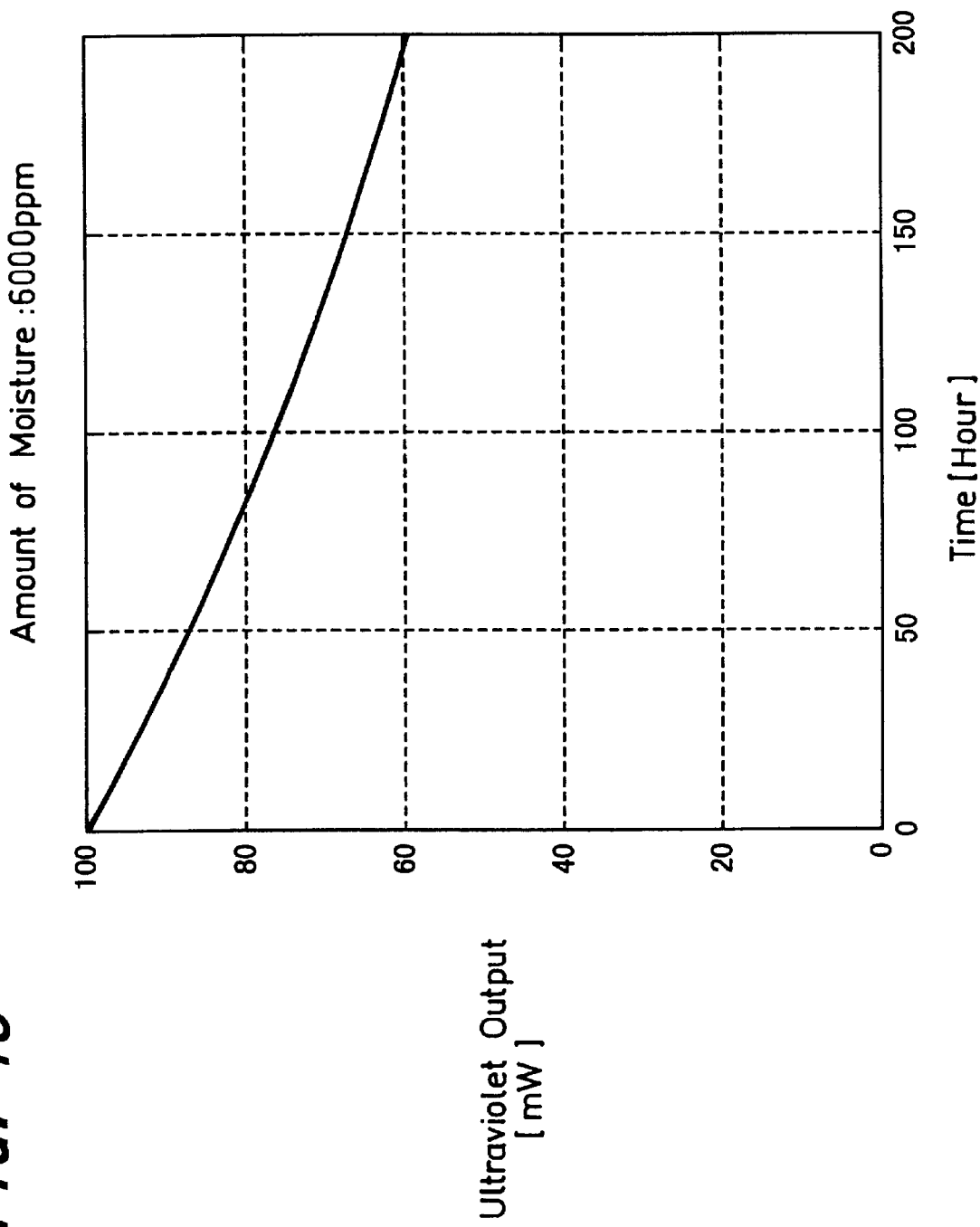
FIG. 16 is a graph showing a secular change in ultraviolet output when an amount of moisture (volume fraction) of a sprayed dry gas is set at 6,000 [ppm] in an ultraviolet optical device according to a comparative example.

The same configuration and operation as those in Example 1 described above are used in Comparative Example 1. However, in this case, an amount of moisture (volume fraction) was set at 6,000 [ppm] which was larger than 5,000 [ppm]. Measurement results of a secular change obtained in this case are shown in FIG. 16. In this case, the output of the device decreased to 60% of the initial value 200 hours after.

Comparative Example 2

Figure 17:
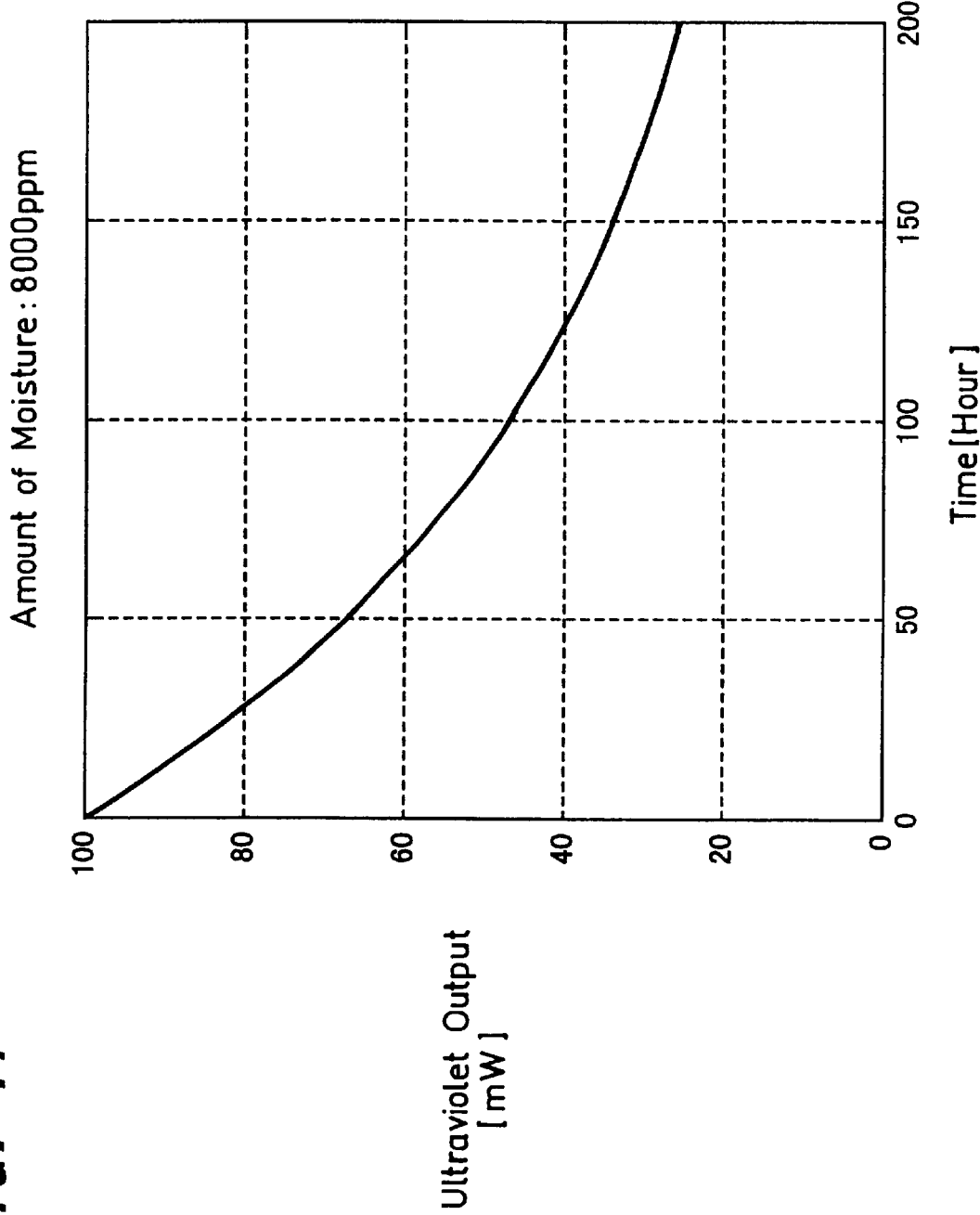
FIG. 17 is a graph showing a secular change in ultraviolet output when an amount of moisture (volume fraction) of a sprayed dry gas is set at 8,000 [ppm] in the ultraviolet optical device according to the comparative example.

The same configuration and operation as those in Example 1 described above are used in Comparative Example 2. However, in this case, an amount of moisture (volume fraction) was set at 8,000 [ppm] which was larger than 5,000 [ppm]. As measurement results of a secular change obtained in this case, as shown in FIG. 17, as in FIG. 16 described above, a decrease in output after 200 hours was considerable generated.

Comparative Example 3

Figure 18:
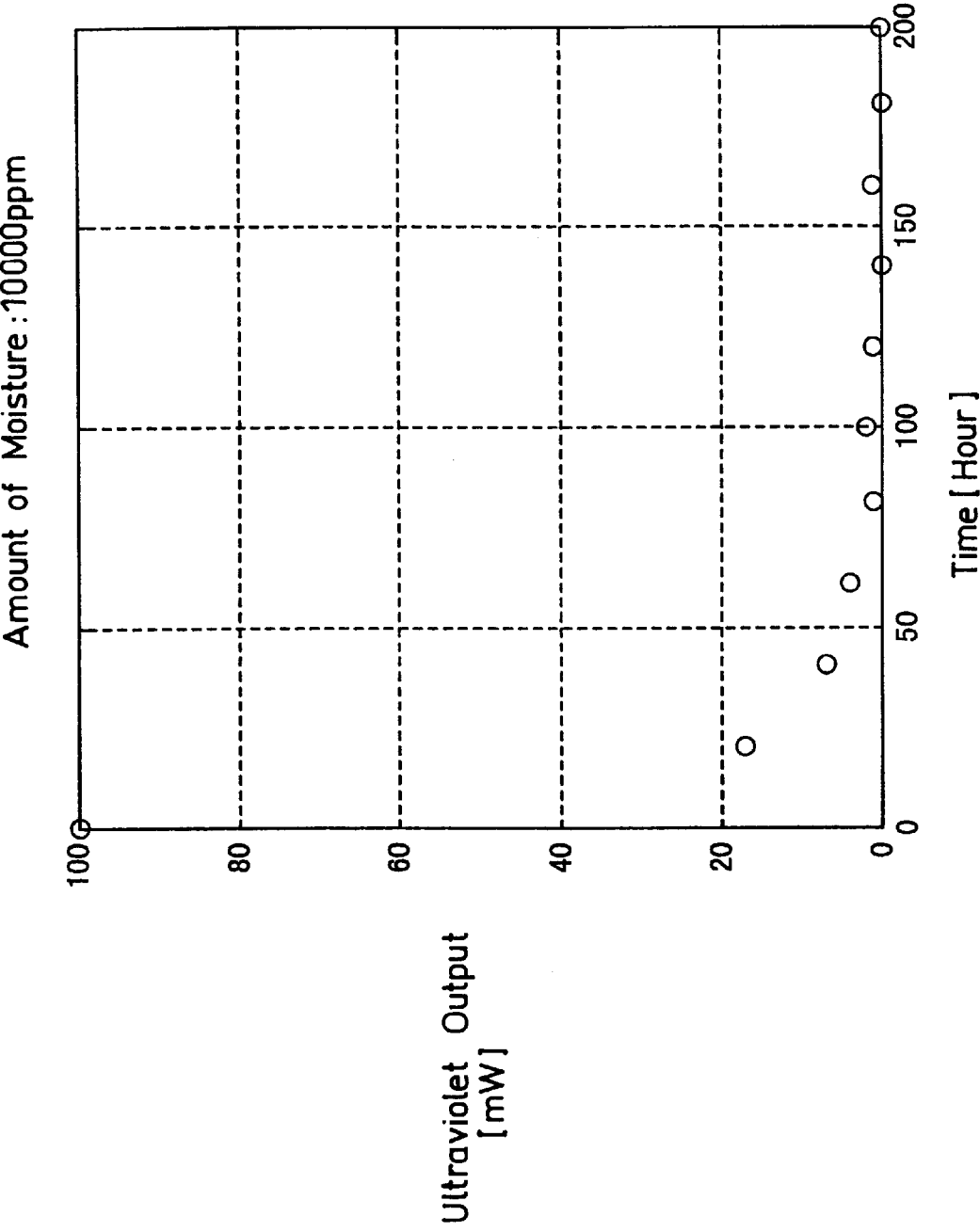
FIG. 18 is a graph showing a secular change in ultraviolet output when an amount of moisture (volume fraction) of a sprayed dry gas is set at 10,000 [ppm] in the ultraviolet optical device according to the comparative example.
Figure 19:
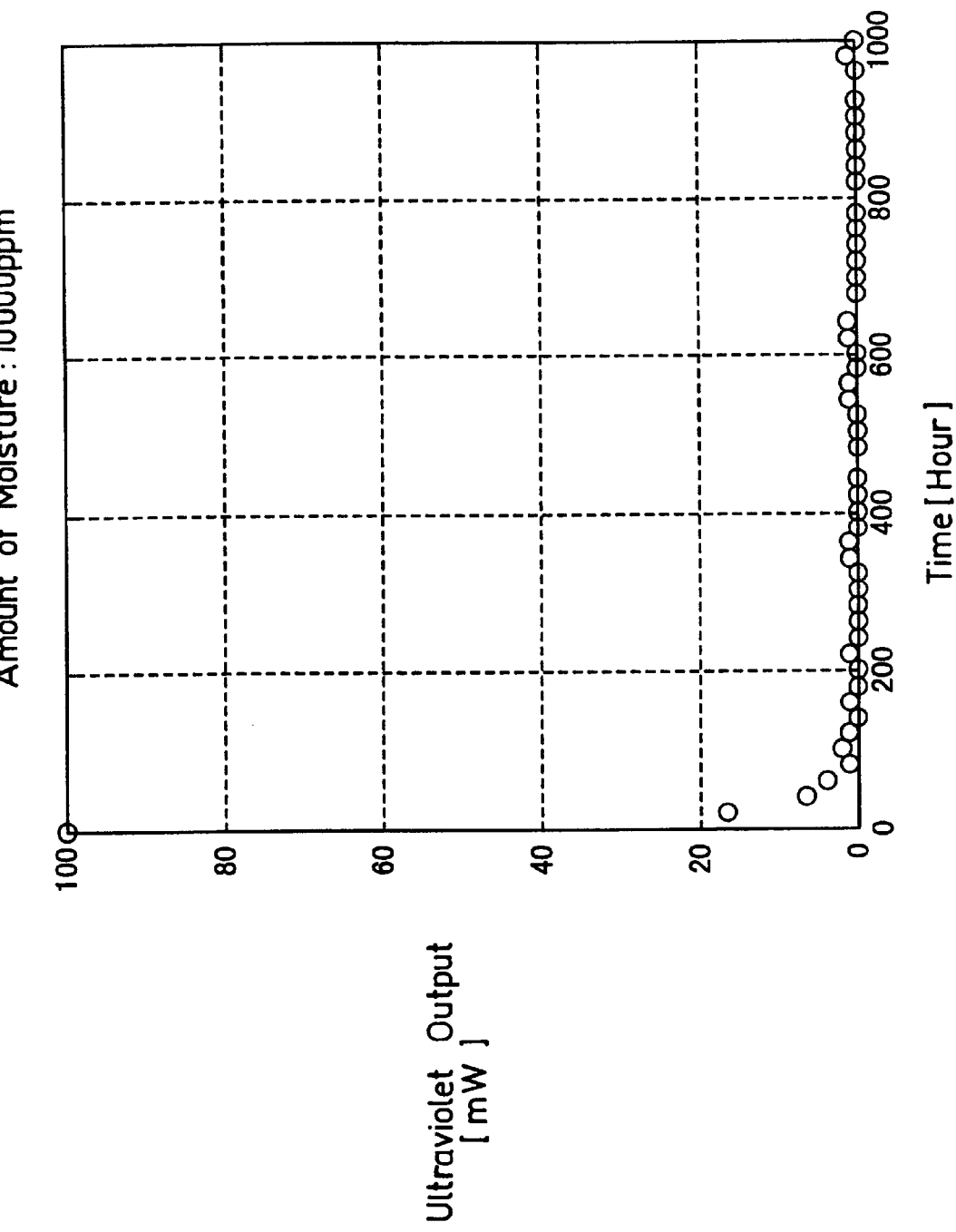
FIG. 19 is a graph showing a secular change in ultraviolet output when an amount of moisture (volume fraction) of a sprayed dry gas is set at 10,000 [ppm] in the ultraviolet optical device according to the comparative example.

The same configuration and operation as those in Example 1 described above are used in Comparative Example 3. However, in this case, an amount of moisture (volume fraction) was set at 10,000 [ppm] which was larger than 5,000 [ppm]. As measurement results of a secular change obtained in this case, as shown in FIGS. 18 and 19, an output decreased even at the initial value.

Figure 8:
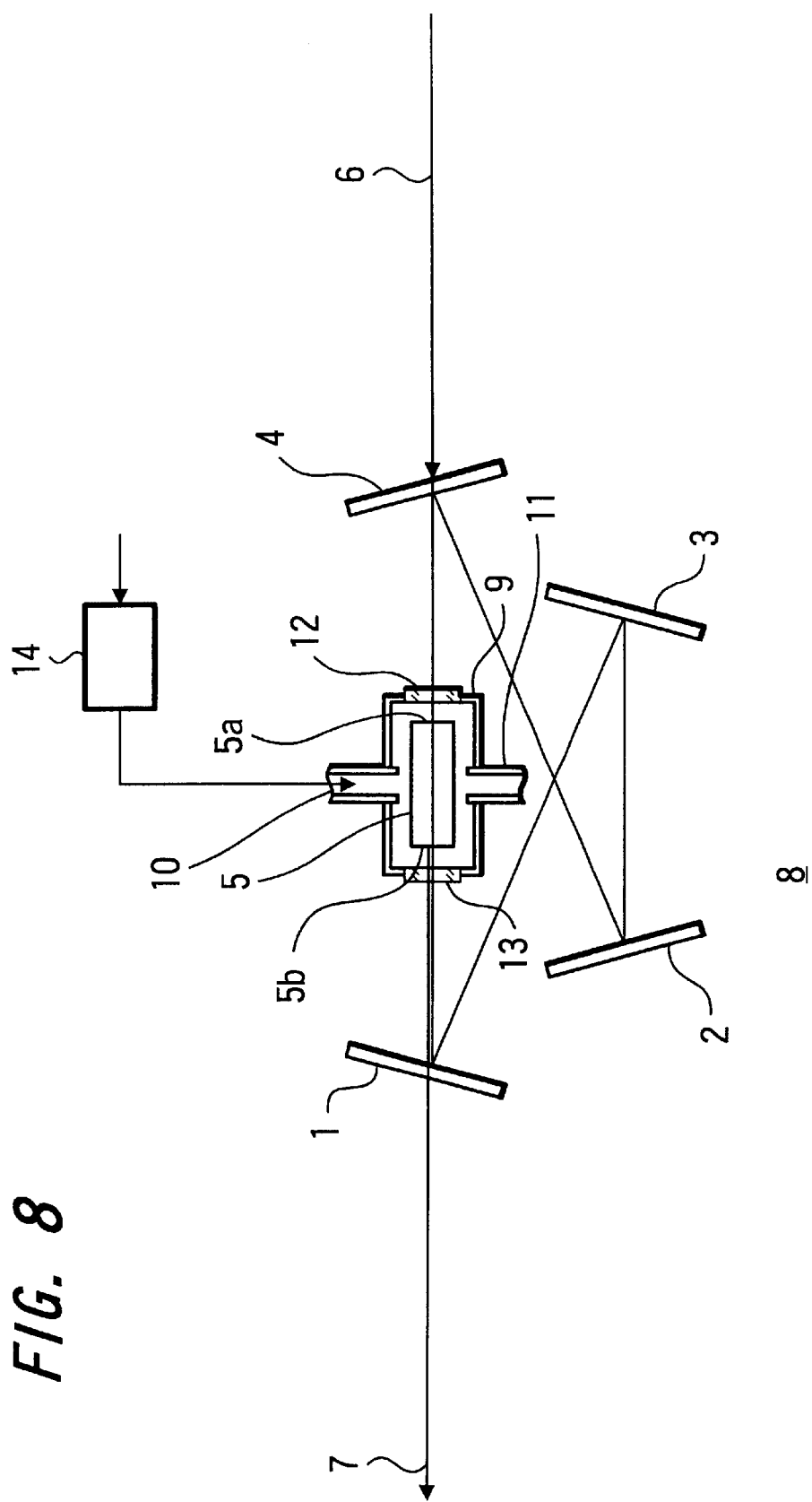
FIG. 8 is a diagram showing an ultraviolet optical device according to the present invention.

In the embodiment described above, although the ultraviolet optical device body 8 is entirely accommodated in the envelope 9, the following configuration can also be employed. That is, as another embodiment, in order to reliably avoid a deterioration in characteristics caused by ultraviolet irradiation on an end face 5b from which an ultraviolet ray of a second harmonic wave in a nonlinear optical element 5 is emitted, as shown in FIG. 8 as an example, only some optical part, e.g., the nonlinear optical element 5 of the ultraviolet optical device body 8 is accommodated in the envelope 9, and a dry gas is sprayed on only the nonlinear optical element 5. Note that the same reference numerals as in FIG. 8 denote the same parts in FIG. 1, and an overlapping description thereof will be omitted.

Figure 9:
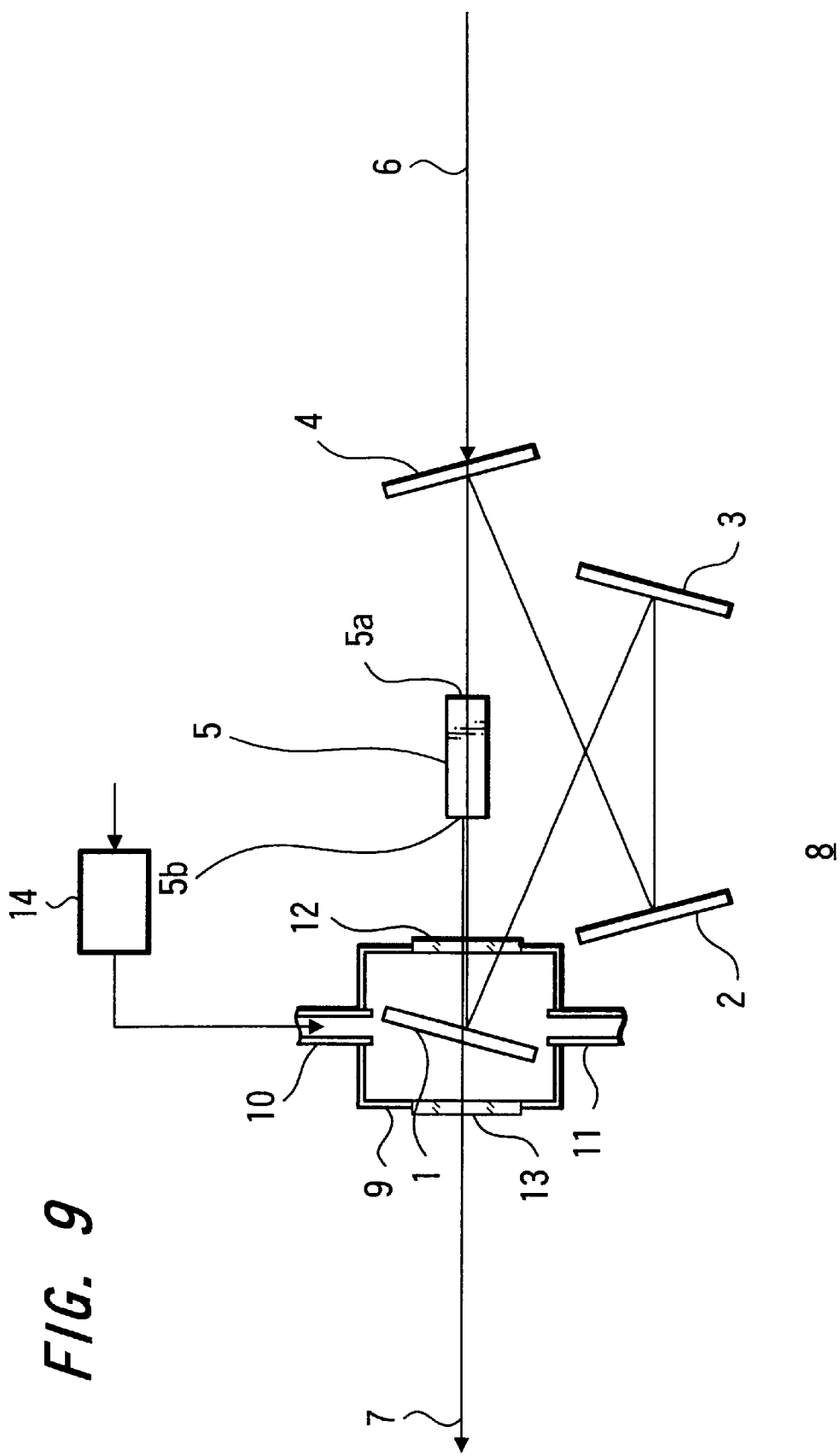
FIG. 9 is a diagram showing an ultraviolet optical device according to the present invention.

FIG. 9 is a schematic diagram of another example of the embodiment. Also in this case, the same reference numerals as in FIG. 9 denote the same parts in FIG. 1. In this example, only a first mirror which is considerably deteriorated when an ultraviolet ray generated from the nonlinear optical element 5 is irradiated with a large dose is accommodated in the envelope 9, and a dry gas is sprayed on only the first mirror 1, so that a deterioration in optical characteristics caused by the ultraviolet irradiation is reliably avoided.

Figure 10:
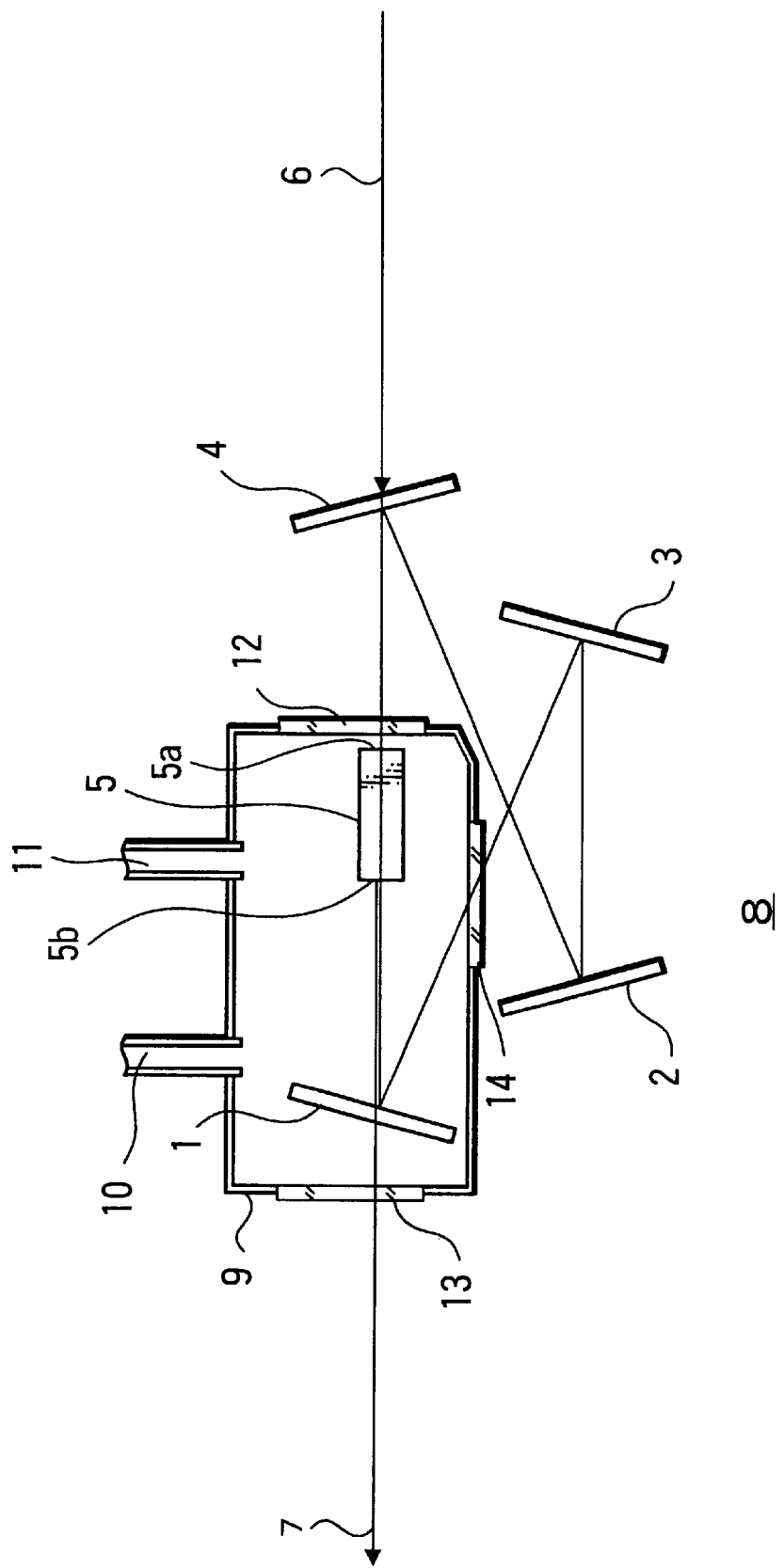
FIG. 10 is a diagram showing an ultraviolet optical device according to the present invention.

In addition, FIG. 10 is a diagram of an example of another embodiment of the present invention. In this example, a first mirror 1 and an emission end face 5a of a nonlinear optical element 5, i.e., the nonlinear optical element 5 of optical parts on which an ultraviolet ray is heavily irradiated are accommodated in an envelope 9, and the other configuration is the same as that in FIG. 1. The same reference numerals as in FIG. 10 denote the same parts in FIG. 1, and an overlapping description thereof will be omitted. In this example, a transparent window 14 is further arranged to prevent the optical paths of the first and third mirrors 1 and 3 from being shielded by the envelope 9.

Figure 11:
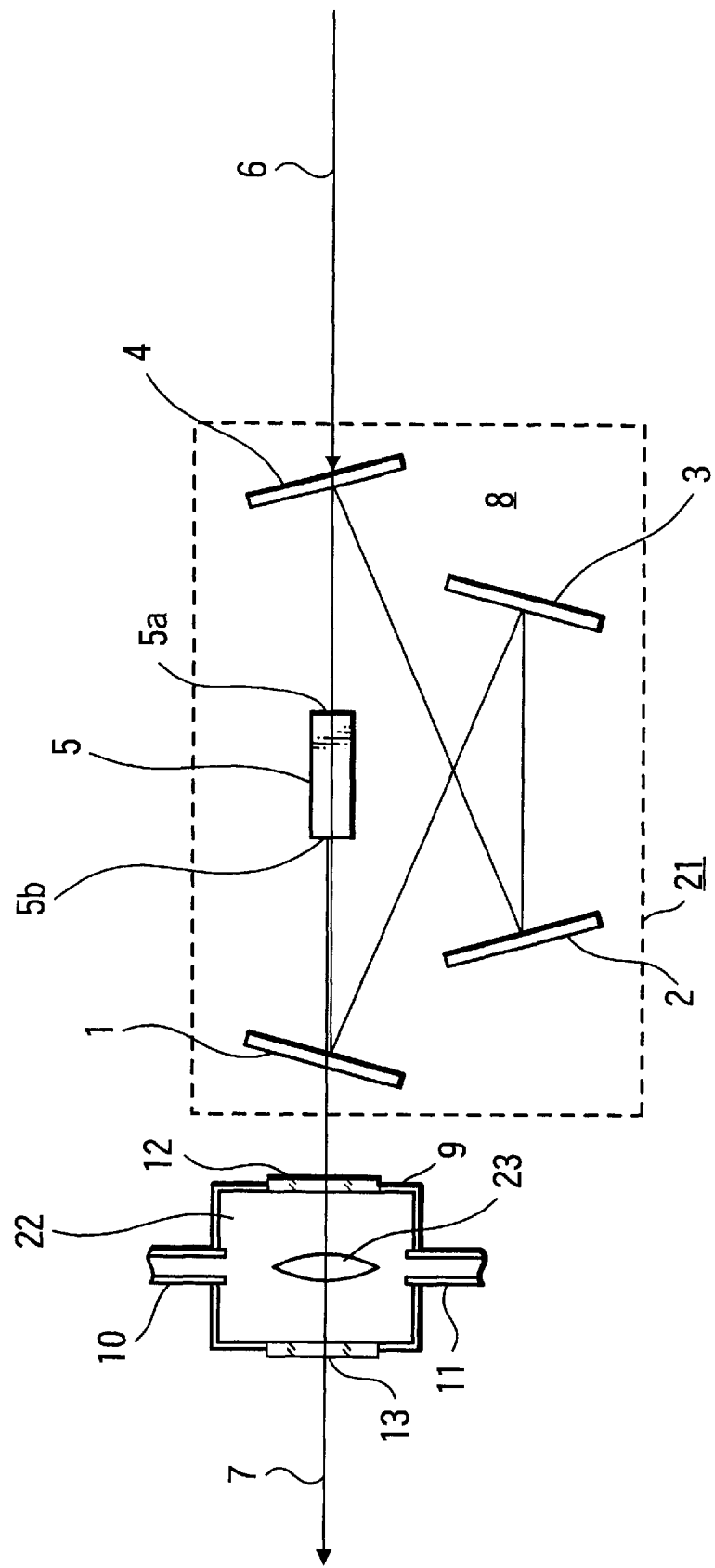
FIG. 11 is a diagram showing an ultraviolet optical device according to the present invention.

The embodiment described above has a configuration in which a secular change in optical characteristics of the optical parts constituting the ultraviolet optical device body 8 is improved. However, in still another embodiment, a deterioration in optical characteristics caused by the ultraviolet irradiation in an ultraviolet optical device on which an ultraviolet ray generated from the ultraviolet generation device is irradiated, e.g., an optical lens system, a mirror which curves an optical path, a beam splitter, or the like is prevented. FIG. 11 is a schematic diagram of an example in this case. However, even the embodiment is not limited to this example.

In the example shown in FIG. 11, e.g., a lens system 22 on which the emission light (ultraviolet ray) 7 from an ultraviolet ray generation device 21 having the configuration described in FIG. 20 or FIG. 1 is incident, i.e., is irradiated is arranged in the envelope 9 having the gas inlet port 10 and the gas outlet port 11, so that the dry gas described above is sprayed on the lens system 22. The same reference numerals as in FIG. 11 denotes the same parts in FIGS. 20 and 1, and an overlapping description thereof will be omitted.

In this embodiment, a dry gas is sprayed on the optical parts in the ultraviolet irradiation device on which an ultraviolet ray is irradiated. However, in the ultraviolet ray generation device 21 serving as an ultraviolet ray source for the ultraviolet irradiation device, the configurations described in, e.g., FIGS. 4 to 10 can also be employed.

As is apparent from the above description, according to the present invention in which a dry gas having an amount of moisture of 5,000 [ppm] or less is sprayed on an optical part on which an ultraviolet ray is irradiated, in the ultraviolet optical device, e.g., the ultraviolet generation device, or the ultraviolet irradiation device, with respect to an optical part whose optical characteristics are deteriorated by the ultraviolet irradiation, improvement in secular change, i.e., a long-time stable operation, that is, a long life is achieved.

In this manner, by spraying the dry gas having an amount of moisture of 5,000 [ppm] or less, improvement in secular change is achieved. However, when a drying device, pipes, maintenance, and the like are considered, or when an object of stabilizing characteristics which is actually requested, the amount of moisture is preferably set to be larger than 1,000 [ppm].

In the example described above, dry air is sprayed. However, when a dry argon gas or a dry nitrogen gas is supplied, the same result as described above can be obtained.

The nonlinear optical element 5 is not limited to a nonlinear optical crystal element consisting of BBO. The nonlinear optical element 5 can also be constituted by a nonlinear optical crystal element consisting of cesium lithium borate $CsLiB_6O_{10}$(CLBO). In this case, with the same configuration as that of each of the examples described above, the same effect as described above can be obtained.

The present invention is not limited to the embodiments described above and the illustrated examples. Combinations of the embodiments and the example, e.g., the configuration of the ultraviolet optical device body 8, e.g., the number of mirrors, an optical path obtained by the mirrors, a resonator structure, the structure of the ultraviolet irradiation device, and the like are variously modified and changed in the configuration of the present invention.

As described above, in the ultraviolet optical device according to the present invention, e.g., an ultraviolet generation device or an ultraviolet irradiation device, a deterioration in optical characteristics caused by ultraviolet irradiation can be effectively prevented.

Therefore, when the device of the present invention is used as a light source of an exposure device for, e.g., photolithography which requires precise processing for a semiconductor device or the like, e.g., a light source for a photoresist, or as a various optical devices in which ultraviolet irradiation is performed. A deterioration in optical characteristics in various optical parts such as lenses, mirrors, and beam splitters in these devices can be effectively avoided. For this reason, the frequency of maintenance performed due to the deterioration in optical characteristics can be reduced, and improvement in productivity can be achieved. The present invention can achieve considerable industry effects.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An ultraviolet optical device comprising optical parts on which an ultraviolet ray is irradiated,
   wherein some or all of the optical parts are arranged in an airtight container having a gas inlet port and a gas output port, the gas inlet port prohibits gas to exit from the airtight container through the gas inlet port, the gas output port prohibits gas to enter into the airtight container through the gas output port, and
   a dry gas led into the airtight container through the gas inlet port is sprayed on at least one of the optical parts and led out from the airtight container through the gas output port.

2. The ultraviolet optical device, including a resonator unit having optical parts on which the ultraviolet ray is irradiated, according to claim 1,
   wherein the resonator unit is arranged in the airtight container, and the dry gas is sprayed on at least one of the optical parts of the resonator unit on which the ultraviolet ray is irradiated.

3. The ultraviolet optical device, having a nonlinear optical element in a resonator unit, according to claim 1,
   wherein the resonator unit having the nonlinear optical element is arranged in the airtight container, and the dry gas is sprayed on at least one of a plurality of optical parts, on which the ultraviolet ray is irradiated, of the resonator unit.

4. The ultraviolet optical device according to claim 3, wherein the dry gas is sprayed on the nonlinear optical element.

5. The ultraviolet optical device, having a nonlinear optical element in a resonator unit, according to claim 3,
   wherein the dry gas is mainly sprayed on a mirror, on which an ultraviolet ray is irradiated, of the resonator unit having the nonlinear optical element.

6. The ultraviolet optical device according to claim 3, wherein the nonlinear optical element is constituted by a barium-borate-based nonlinear optical crystal.

7. The ultraviolet optical device according to claim 3, wherein the nonlinear optical element is constituted by a cesium-lithium-borate-based nonlinear optical crystal.

8. The ultraviolet optical device, having a nonlinear optical element in a resonator unit, according to claim 1,
   wherein at least the nonlinear optical element is arranged in the airtight container, and the dry gas is sprayed on the nonlinear optical element.

9. The ultraviolet optical device having a nonlinear optical element in a resonator unit according to claim 1,
   wherein the resonator unit having the nonlinear optical element comprises a mirror that leads an ultraviolet ray from the nonlinear optical element and is arranged in the airtight container, and the dry gas is sprayed on the mirror.

10. The ultraviolet optical device according to claim 1, wherein an amount of moisture of the dry gas is not larger than 5,000 ppm as a volume fraction.

11. The ultraviolet optical device according to claim 1,
    wherein the relationship between time T1 at which an ultraviolet output becomes half an initial output and a volume fraction Rw of moisture of an arrangement portion of at least one of the optical parts on which the ultraviolet ray is irradiated is expressed by the following expression:

$$T1 \geq (5 \times 10^4 \gamma_{SH}^{0.5} P_{UV}^{-0.5} \exp(-0.00081381 \cdot Rw))^* (-P_i + P_{UV} + 0.5^{-0.5}(P_i - P_{UV}/2)),$$

where, $P_i$, $P_{UV}$, and $\gamma_{SH}$ are constants, $P_i$ is an output of an incident fundamental wave onto the nonlinear optical element, $P_{UV}$ is an ultraviolet output on an emission end face of a nonlinear optical element, and $\gamma_{SH}$ is a nonlinear conversion factor.

12. An ultraviolet optical device, having a nonlinear optical element in a resonator unit, for generating an ultraviolet ray,
    wherein the relationship between time T at which an ultraviolet output is x with respect to an initial output and a volume fraction Rw of moisture of an arrangement portion of at least one of a plurality of optical parts on which the ultraviolet ray is irradiated is expressed by the following expression:

$$T \geq (5 \times 10^4 \gamma_{SH}{}^{0.5} P_{UV}{}^{-0.5} \exp(-0.00081381 \cdot Rw))^* (-P_i + P_{UV} + x^{-0.5}(P_i - P_{UV}/2)),$$

where, $P_i$, $P_{UV}$, and $\gamma_{SH}$ are constants, $P_i$ is an output of an incident fundamental wave onto the nonlinear optical element, $P_{UV}$ is an ultraviolet output on an emission end face of the nonlinear optical element, and $\gamma_{SH}$ is a nonlinear conversion factor.

13. An ultraviolet optical device, having a nonlinear optical element in a resonator unit, for generating an ultraviolet ray, wherein the relationship between an increase in in-resonator loss $\Delta\delta/\Delta T$ per unit time and a volume fraction Rw of moisture of an arrangement portion of at least one of a plurality of optical parts on which the ultraviolet ray is irradiated is expressed by the following expression:

$$\Delta\delta/\Delta T \leq 2 \times 10^{-5} \exp(-0.00081381 \cdot Rw).$$

* * * * *